United States Patent [19]
Noguchi et al.

[11] Patent Number: 5,862,022
[45] Date of Patent: Jan. 19, 1999

[54] FERROMAGNETIC TUNNEL JUNCTION, MAGNETORESISTIVE ELEMENT AND MAGNETIC HEAD

[75] Inventors: Kiyoshi Noguchi; Taro Oike, both of Saku; Satoru Araki, Chiba; Manabu Ohta; Masashi Sano, both of Saku, all of Japan

[73] Assignee: TDK Corporation, Tokyo, Japan

[21] Appl. No.: 933,347

[22] Filed: Sep. 19, 1997

[30]   Foreign Application Priority Data

| Sep. 19, 1996 | [JP] | Japan | 8-248410 |
| Dec. 10, 1996 | [JP] | Japan | 8-330064 |
| Mar. 7, 1997 | [JP] | Japan | 9-053065 |

[51] Int. Cl.$^6$ ............... G11B 5/39; G11C 11/00; H01L 41/12
[52] U.S. Cl. ............ 360/113; 257/421; 365/158
[58] Field of Search ............ 360/113; 365/158; 257/421

[56]   References Cited

U.S. PATENT DOCUMENTS

| 5,018,037 | 5/1991 | Krounbi et al. . |
| 5,206,590 | 4/1993 | Dieny et al. . |
| 5,729,410 | 3/1998 | Fontana .................. 360/113 |

FOREIGN PATENT DOCUMENTS

| 4-42417 | 2/1992 | Japan . |
| 4-103013 | 4/1992 | Japan . |
| 4-103014 | 4/1992 | Japan . |
| 8-21166 | 3/1996 | Japan . |

OTHER PUBLICATIONS

T. Miyazaki, et al., "Giant Magnetic Tunneling Effect In Fe/Al$_2$O$_3$/Fe Junction", Journal of Magnetism and Magnetic Materials 139 (1995), pp. 231–234.

M. Pomerantz, et al., "Strongly Coupled Ferromagnetic Resonances of Fe Films", Journal of Applied Physics, vol. 61, No. 8, Apr. 15, 1987, pp. 3747–3749.

S. Maekawa, et al., "Electron Tunneling Between Ferromagnetic Films", IEEE Transactions on Magnetics, vol. MAG–18, No. 2, Mar. 1982, pp. 707–708.

*Primary Examiner*—A. J. Heinz
*Attorney, Agent, or Firm*—Oblon, Spivak, McClelland, Maier & Neustadt, P.C.

[57]   ABSTRACT

This invention is directed to a ferromagnetic tunnel junction, an MR element and a magnetic head. A ferromagnetic tunnel junction is constituted by sequentially laminating a first ferromagnetic film, an insulating film and a second ferromagnetic film. These are laminated on an appropriate insulating substrate. The present invention is characterized in that the barrier potential of the insulating film is set within a range of 0.5 to 3 eV. A ferromagnetic tunnel junction with which a high MR ratio can be achieved with good reproduction characteristics is provided.

52 Claims, 27 Drawing Sheets

FERROMAGNETIC TUNNEL JUNCTION, MAGNETORESISTIVE ELEMENT AND MAGNETIC HEAD

BACKGROUND OF THE INVENTION

1. Field of the Invention

The present invention relates to a ferromagnetic tunnel junction, a magnetoresistive element (hereafter referred to as MR element) which employs the ferromagnetic tunnel junction as a sensing portion and it also relates to a magnetic head employing this element.

2. Discussion of Background

Magnetoresistive heads (hereafter referred to as MR heads) that utilize the anisotropic magnetoresistance (hereafter referred to as AMR) effect are in commercial production as magnetic heads for high density magnetic recording. However, since an AMR head typically employs an AMR effect film such as NiFe to constitute the magnetic film, its magnetoresistive ratio (hereafter referred to as MR ratio) and sensitivity are low, at approximately 2% and 0.5%/Oe respectively. Therefore, development of magnetoresistive films (hereafter referred to as MR films) with a higher MR ratio and a higher sensitivity is required.

As a technology that will meet this requirement, a new phenomenon, i.e., the giant magnetoresistance effect (hereafter referred to as GMR effect), has come to light in recent years and since it affords a greater MR ratio compared to the AMR effect film in the prior art, much research into this phenomenon has been conducted. In particular, the GMR effect achieved by utilizing a spin valve (SV) film has become the focus of great interest. Since a spin valve film with a film structure constituted of ferromagnetic film/non-magnetic metallic film/ferromagnetic film/antiferromagnetic film, which creates the GMR effect, demonstrates characteristics with a high degree of sensitivity, at 2 to 5%/Oe, it is thought to have potential as a reproduction element in a next generation magnetic head and further research has commenced toward achieving practical utilization thereof.

Apart from the GMR effect, the phenomenon known as the ferromagnetic tunneling effect, whereby a tunneling effect manifests depending upon the relative angles of magnetization of two ferromagnetic films in a junction constituted of a ferromagnetic film/insulating film/ferromagnetic film, is of interest and research into development of an MR element utilizing this phenomena has been in progress. Since a ferromagnetic tunneling effect film provides an extremely high degree of magnetic field sensitivity, it has potential to be adopted as a reproduction magnetic head in ultra high density magnetic recording on the order of 10 Gbit/inch$^2$. In IEEE Trans. Magn., MAG-18, 707 (1982), S. Maekawa, V. Gafvert et. al. demonstrated theoretically and through experiment that the manifestation of the tunneling effect depends upon the relative angles of magnetization of the two magnetic films in a magnetic film/insulating film/magnetic film junction.

Japanese Unexamined Patent Publication (KOKAI) No. 42417/1992 discloses a magnetic head provided with a ferromagnetic tunneling effect film capable of detecting minute changes in leaked magnetic flux with a higher degree of sensitivity and a higher degree of resolution than an MR head in the prior art and also discloses that the reproduction sensitivity can be further improved by reducing the junction area to reduce the incidence of pinhole formation in the insulating film.

In addition, Japanese Unexamined Patent Publication (KOKAI) No. 103014/1992 discloses a ferromagnetic tunneling effect film that applies a bias magnetic field from an antiferromagnetic film to a magnetic film and a magnetic head employing this ferromagnetic tunneling effect film.

Furthermore, T. Miyazaki, N. Tezuka et. al. report in J. Magn. Magn. Mater. 139 (1995) L231 that an MR ratio of 18% was achieved at room temperature in an Fe/Al$_2$O$_3$/Fe tunnel junction. In addition, M. Pomerantz, J. C. Sloczewski, E. Spiller et.al. disclose an Fe/a-Carbon/Fe film.

There are a number of problems that have yet to be addressed in the various types of ferromagnetic tunnel junctions that have been disclosed to date.

Publications on the known art such as Japanese Unexamined Patent Publication (KOKAI) No. 42417/1992, for instance, disclose several means for detecting minute changes in a magnetic flux with a high degree of sensitivity by employing an MR element provided with a ferromagnetic tunneling effect film in order to achieve a high, stable output. In one of such means, one of a pair of magnetic films constituting an MR film with a multilayer structure, namely, the magnetic film whose direction of magnetization changes due to leak magnetic flux from the medium, is required to have a reduced anisotropic dispersion angle and to have a single magnetic domain to ensure that the magnetization rotation occurs entirely and at once. To be more specific, a single magnetic domain is achieved by inserting an intermediate film such as BN in the magnetic film.

However, even with a film with a small anisotropic dispersion angle formed in this manner, there is still a problem in that when the film is patterned to a size of several $\mu$m to be operated in a high frequency magnetic field at or above several tens of MHz, disturbance in units of microns in the spinning direction occurs at the end portions of the finely patterned film, thereby forming a magnetic domain wall, which, in turn, disrupts the single magnetic domain structure and results in Barkhausen noise and the like.

Next, in regard to the AMR magnetic head and the spin valve GMR magnetic heads in the prior art, a method for preventing Barkhausen noise by forming a magnetic domain control film at the two end portions of the MR film to apply a longitudinal bias has been disclosed (prior art publications: U.S. Pat. No. 5,018,037 and Japanese Examined Patent Publication No. 21166/1996). In these structures, the magnetic domain control films are formed in direct contact with the areas of the two end portions of the entire sensing portion, since as an AMR head or a spin valve GMR head is used with the current being supplied in a direction parallel to the surface of the MR element, no problem is posed in practical use, even if the magnetic domain control films are in contact with the two end portions of the sensing portion.

However, in a ferromagnetic tunnel junction in which a first ferromagnetic film, an insulating film and a second ferromagnetic film are laminated in the vertical direction, a change in magnetoresistance occurs because of a tunnel current flowing in the direction of the lamination. Thus, if bias magnetic layers for magnetic domain control are placed in contact with the overall end portions of the sensing portion as in the prior art, the upper and lower ferromagnetic films, which are separated by the insulating film, become electrically shorted, cutting off the tunnel current and, consequently, no magnetoresistance change is achieved.

In order to adopt a shield type magnetic head in high density recording/reproduction, it is necessary to reduce the distance between the shields at the ABS. In a shield type magnetic head, an insulating film constituted of alumina and so on, for instance, is normally provided in order to maintain insulation between the ferromagnetic tunnel junction and the shield films in addition to the ferromagnetic tunnel junction between the shields.

Consequently, in order to reduce the distance between the shields, the thicknesses of the insulating film and the ferromagnetic tunnel junction must be set as small as possible. However, if the electrode film is made to be exposed at the ABS as disclosed in the publications on the known art, even with the thicknesses of the insulating film and the ferromagnetic tunnel junction reduced, a certain distance is still required between the electrode film and the shield films, constituting an obstacle to reduction of the shield distance and, therefore, it is not suited for high density recording/reproduction.

In the publications on the known art, the area over which the electrode film is provided is large to ensure that all current runs through the ferromagnetic tunnel junction. However, since it is necessary to assure resisting voltage equal to or greater than a specific level between the ferromagnetic tunnel junction and the shield films, if the electrode film is made to be exposed at the ABS taking up a large area, as disclosed in the publications on the known art, dielectric breakdown due to static electricity tends to occur, and therefore it is not desirable.

It is to be noted that the ferromagnetic tunnel junction according to the present invention is the same as the ferromagnetic tunneling effect film described above.

SUMMARY OF THE INVENTION

It is an object of the present invention to provide a ferromagnetic tunnel junction that can achieve a high MR ratio while also achieving good reproduction characteristics.

It is a further object of the present invention to provide a ferromagnetic tunnel junction that, applied in an MR element, a magnetic head or the like, allows simplification of the overall structure.

It is a still further object of the present invention to provide an MR element in which a sufficiently large tunnel current can be supplied to the ferromagnetic tunnel junction to achieve a high MR ratio.

It is a still further object of the present invention to provide an MR element that achieves a good output waveform without distortion.

It is a still further object of the present invention to provide an MR element that is capable of achieving a stable output without noise.

It is a still further object of the present invention to provide a ferromagnetic tunnel junction type magnetic head that achieves a reduction in the distance between the shields and is suited for high density recording/reproduction.

It is a still further object of the present invention to provide a ferromagnetic tunnel junction type magnetic head that effectively prevents dielectric breakdown which would occur between the electrode film and the shield films.

In order to achieve the objects described above, according to the present invention, in a ferromagnetic tunnel junction constituted by sequentially laminating a first ferromagnetic film, an insulating film and a second ferromagnetic film, the barrier potential of the insulating film is set within a range of 0.5 to 3 eV.

In the case of the present invention, in which the barrier potential is set within the range of 0.5 to 3 eV, a high MR ratio is achieved while also achieving good reproduction characteristics. It is assumed that one of the reasons for this is that by maintaining the barrier potential within the range of 0.5 to 3 eV, formation of a consistent insulating film 210 with an extremely small number of pinholes is assured.

It is assumed that another contributing factor is a stable antiferromagnetically coupling between the first ferromagnetic film and the second ferromagnetic film via the insulating film within the barrier potential range described above. Particularly advantageous results are achieved when the barrier potential is maintained within a range of 1.5 to 2.5 eV.

When the barrier potential exceeds 3 eV, a high MR ratio cannot be achieved. Although the reason for this is not yet clear, it is thought to be due to the fact that the tunnel current stops running when the barrier potential exceeds 3 eV.

When the barrier potential falls below 0.5 eV, a high MR ratio, which is expected of this type of ferromagnetic tunnel junction, cannot be achieved. The reason for this is thought to be degradation in the uniformity of the insulating film with an increasing the number of pinholes.

Now, the stable antiferromagnetically coupling formed between the first ferromagnetic film and the second ferromagnetic film via the insulating film within the barrier potential range of 0.5 to 3 eV in this ferromagnetic tunnel junction offers a great advantage when it is adopted as a read magnetic conversion element in a magnetic head.

When antiferromagnetically coupling is generated, the magnetic field-magnetoresistance curves achieve the highest values for MR ratio in the area in the vicinity of zero magnetic field. Consequently, when this ferromagnetic tunnel junction is employed for a magnetic conversion read element in a magnetic head, a linear area is obtained in the vicinity of the zero magnetic field simply as a shape effect without having to apply a bias magnetic field. Thus, the structure of the magnetic head can be simplified.

The MR element according to the present invention employs the ferromagnetic tunnel junction described above as a sensing portion. Consequently, it is possible to provide an MR element that can achieve a high MR ratio while also achieving simplification of the structure.

The MR element according to the present invention is desirably provided with magnetic domain control films. The magnetic domain control films are provided adjacent to the two end portions of either the first ferromagnetic film or the second ferromagnetic film.

Since, as described above, the magnetic domain control films are provided adjacent to the two end portions of either the first ferromagnetic film or the second ferromagnetic film, there is no room for an electrical short to occur between the first ferromagnetic film and the second ferromagnetic film. As a result, it is possible to supply a sufficiently large tunnel current to the ferromagnetic tunnel junction. Thus, a large MR ratio is achieved.

Furthermore, with the magnetic domain control film, the ferromagnetic film provided with the magnetic domain control film can be set in a state of a single magnetic domain. This prevents Barkhausen noise which causes distortion in the output waveform, thereby achieving a noiseless and stable output.

It is desirable that either of the first ferromagnetic film or the second ferromagnetic film, the ferromagnetic film without the magnetic domain control films is provided with a magnetization pinning film.

This structure, in which either the first ferromagnetic film or the second ferromagnetic film constitutes a pinned ferromagnetic film provided with a magnetization pinning film and the other ferromagnetic film is made to operate as a free ferromagnetic film, allows the relative angle of the direction of magnetization of the first ferromagnetic film and the direction of magnetization of the second ferromagnetic film to be changed simply by moving the direction of magnetization of the free ferromagnetic film. In this case, it is preferable to set the directions so that the magnetic easy axis of the free ferromagnetic film is perpendicular to the external magnetic field and the magnetic easy axis of the pinned ferromagnetic film is parallel to the external magnetic field. Since this sets the direction of magnetization of the free ferromagnetic film and the direction of magnetization of the pinned ferromagnetic film perpendicular to each other when the external magnetic field is at zero, an output waveform with good symmetry is achieved. Furthermore, since the direction of magnetization of the free ferromagnetic film is changed in the magnetization rotation mode by an external magnetic field, a high degree of sensitivity is achieved and, at the same time, smooth magnetization reversal is executed, thereby reducing generation of Barkhausen noise resulting from the magnetic domain wall motion.

The magnetic head according to the present invention comprises a slider and at least one magnetic conversion element. The slider is provided with an air bearing surface at the side facing opposite the magnetic recording medium. The magnetic conversion element includes the ferromagnetic tunnel junction described above and an electrode film, and is supported by an insulating film that constitutes a portion of the slider.

The ferromagnetic tunnel junction includes an insulating film, a first ferromagnetic film and a second ferromagnetic film. The first ferromagnetic film and the second ferromagnetic film are laminated via the insulating film.

The electrode film includes a first electrode film and a second electrode film, with the first electrode film connected to the first ferromagnetic film and the second electrode film connected to the second ferromagnetic film. The first electrode film and the second electrode film are provided so that they are not exposed at the air bearing surface.

It has been learned that by achieving a structure in which the first electrode film and the second electrode film are not exposed at the ABS as described above, electrostatic breakdown becomes less likely to occur at the magnetic shield films and the ferromagnetic tunnel junction and, in particular, between the first electrode film and the second electrode film, improving the resisting voltage characteristics.

Furthermore, since the distance between the magnetic shield films and the ferromagnetic tunnel junction that constitutes the sensing portion can be reduced at the ABS, higher density recording/reproduction compared to the prior art becomes possible.

Figure 31:
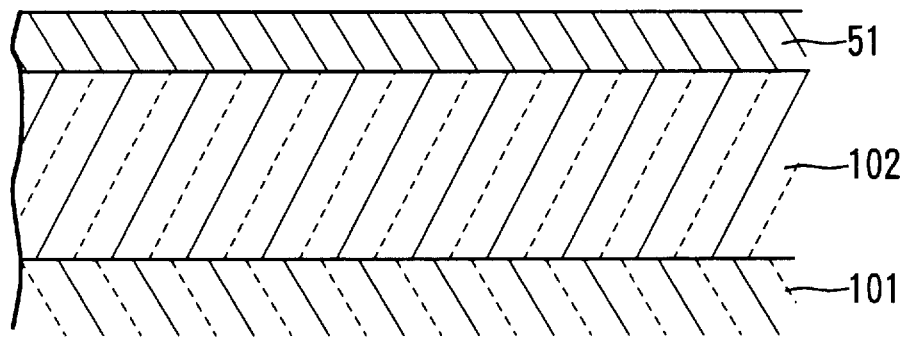
FIG. 31 is a diagram illustrating the method for manufacturing the magnetic head according to the present invention, showing a process following the process shown in FIG. 30.
Figure 32:
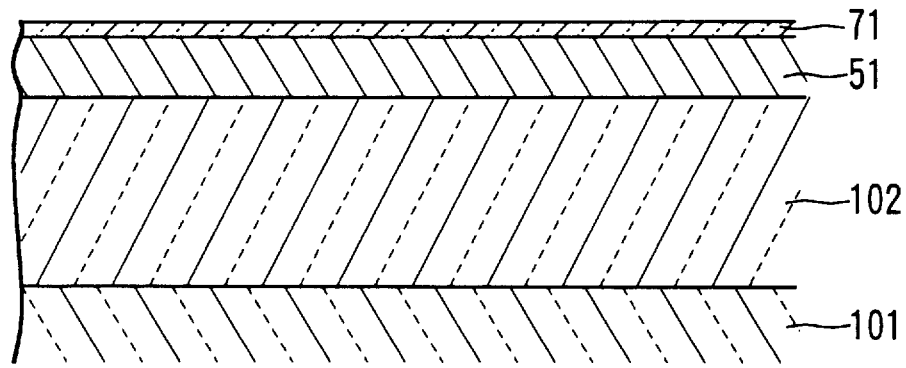
Figure 33:
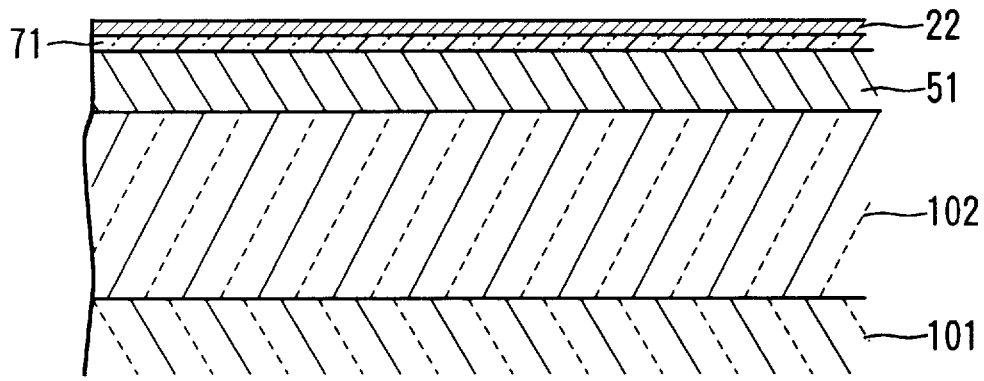
Figure 34:
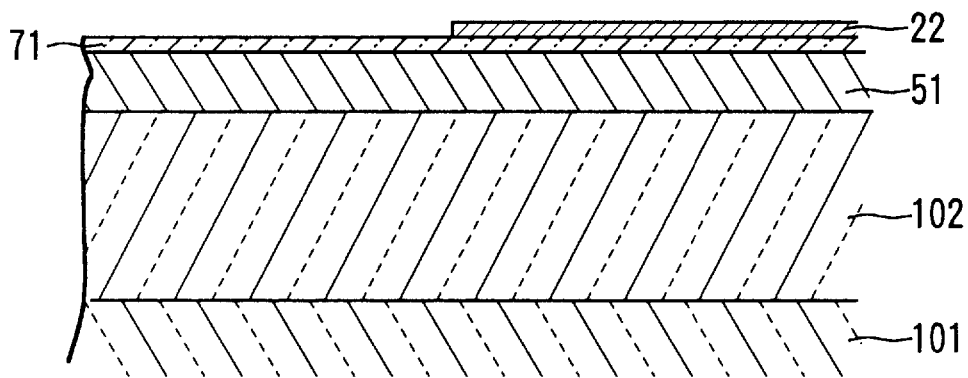
Figure 35:
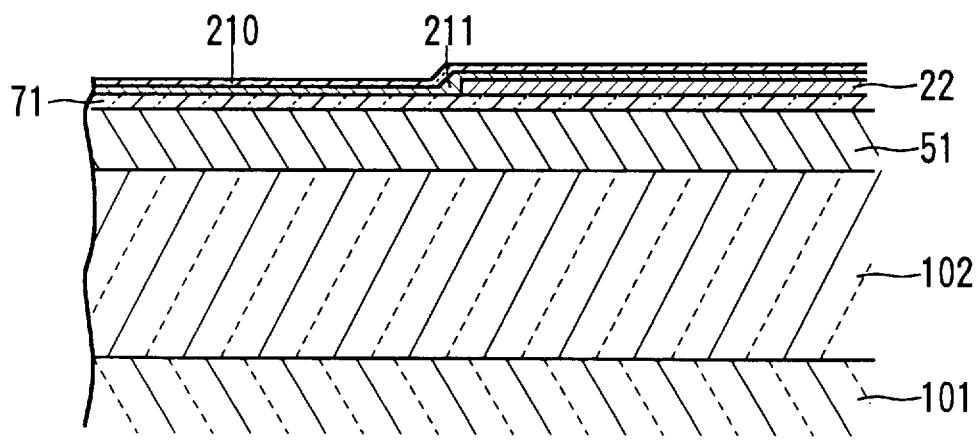
Figure 36:
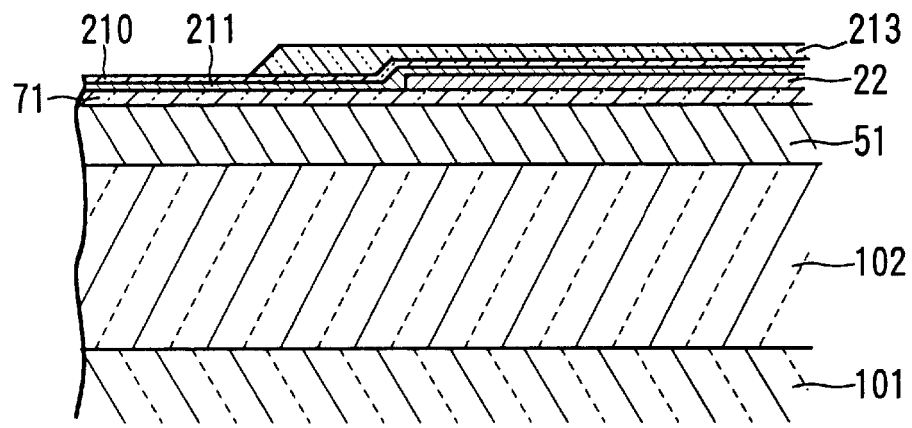
Figure 37:
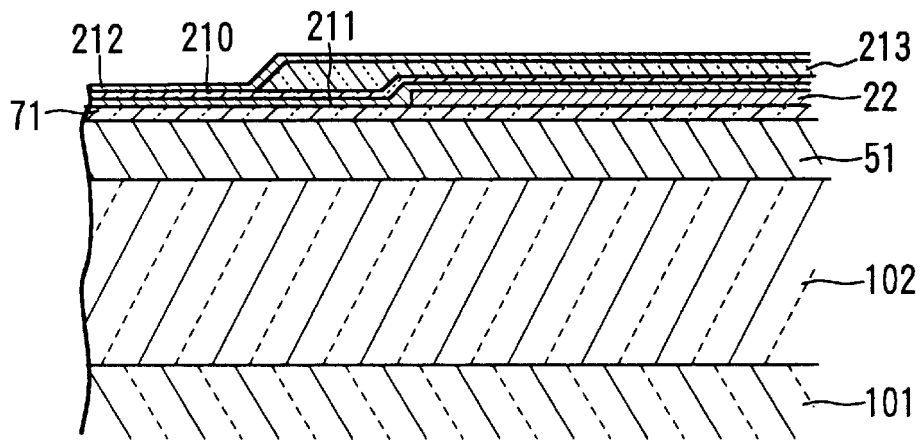
Figure 38:
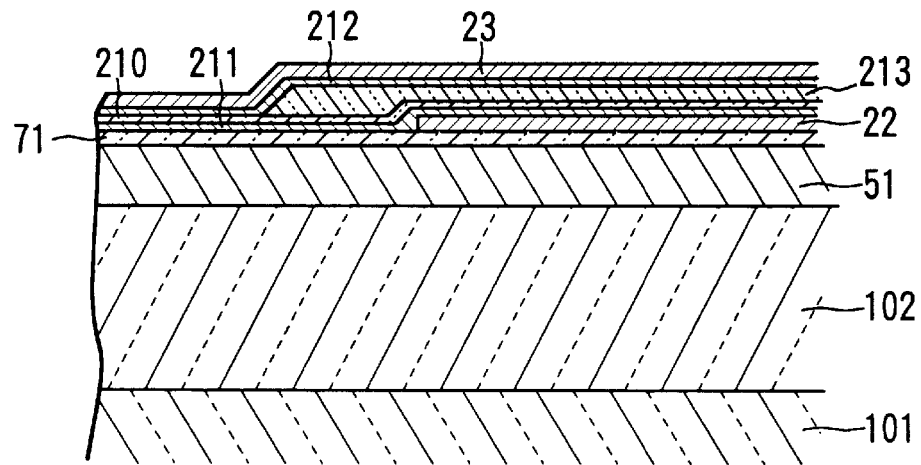
Figure 39:
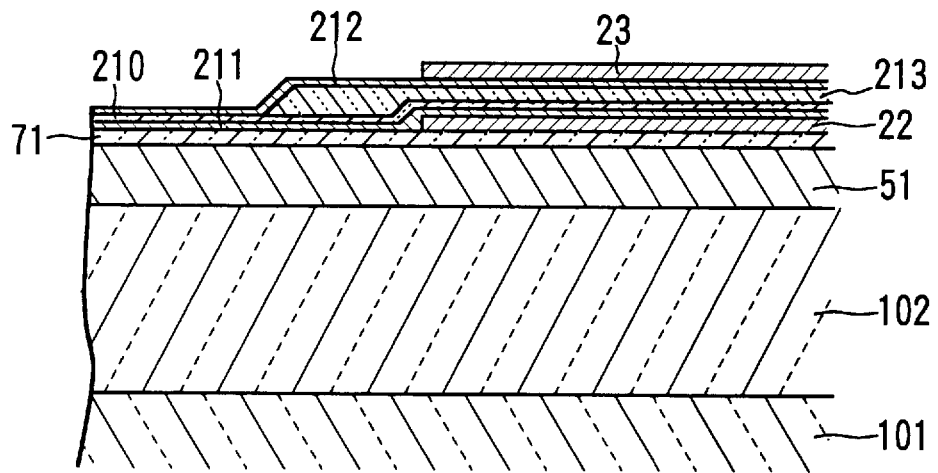
Figure 40:
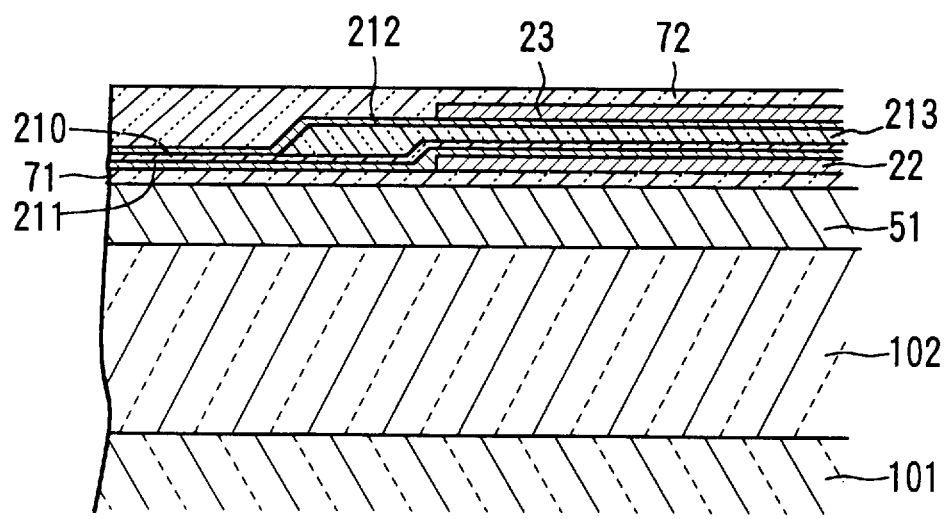
Figure 41:
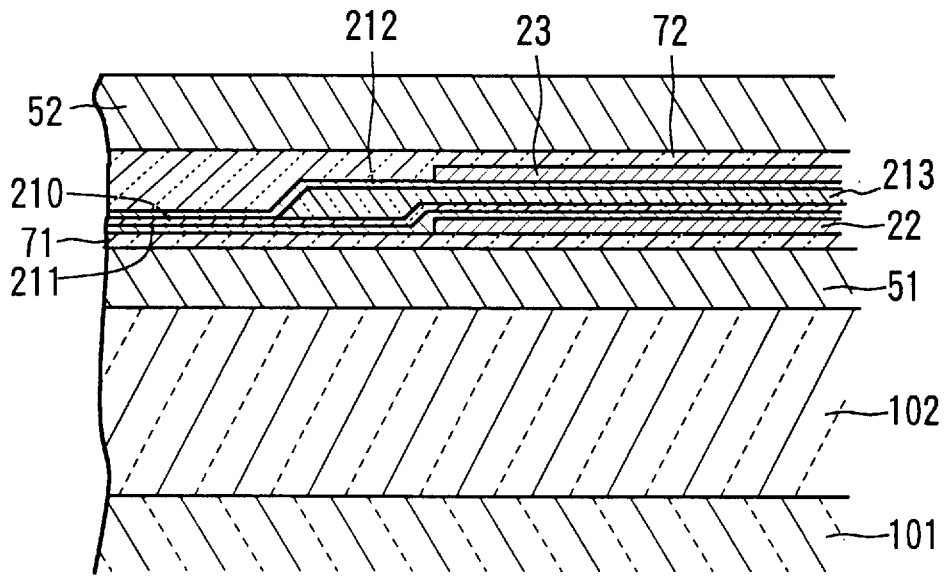
Figure 42:
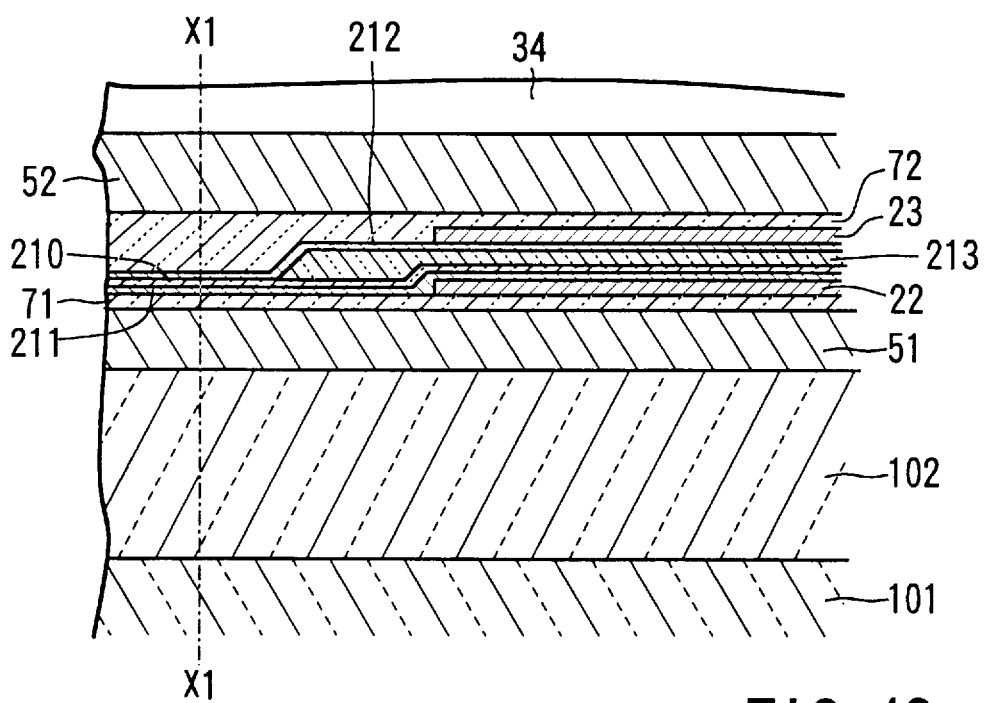
Figure 43:
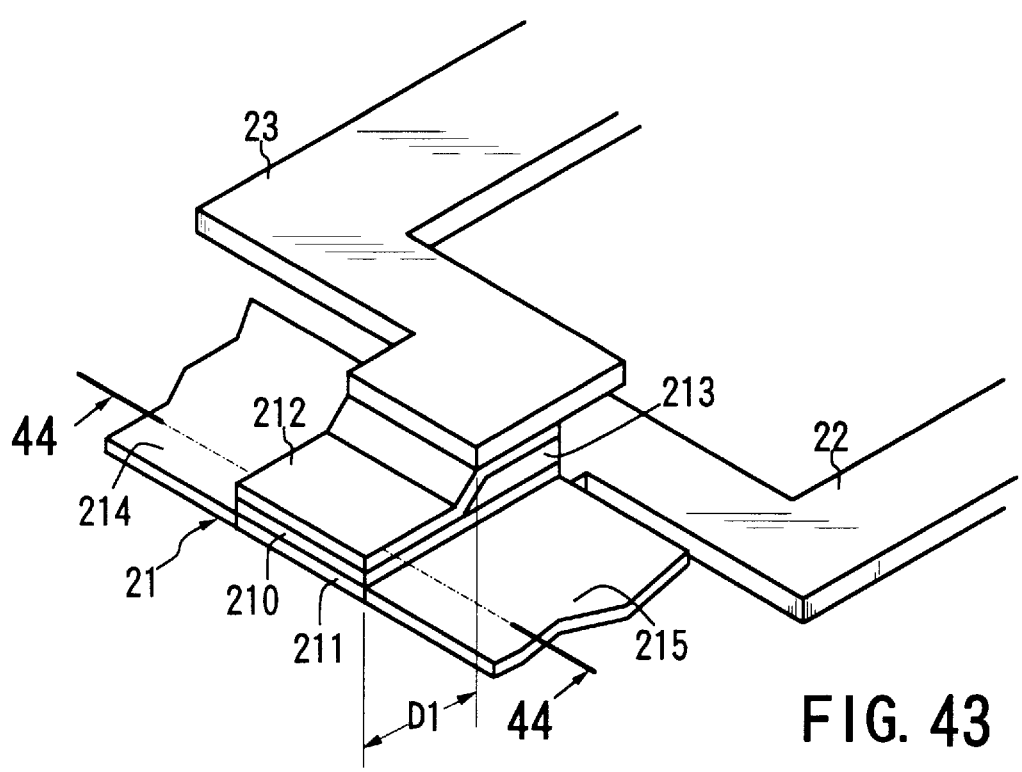
Figure 44:
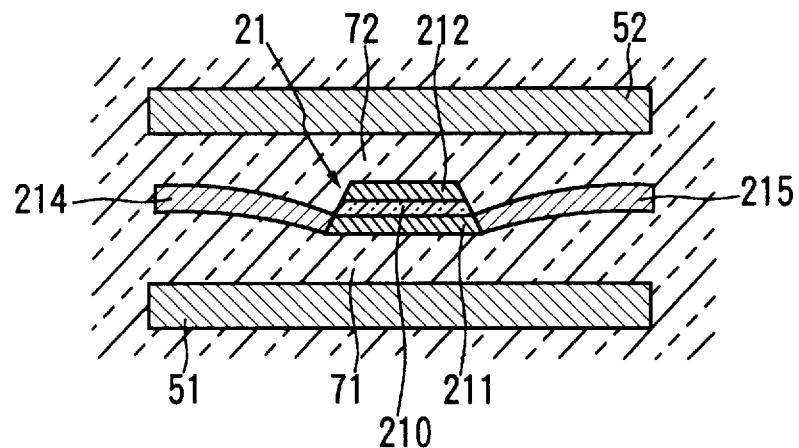

FIG . 32 is a diagram illustrating the method for manufacturing the magnetic head according to the present invention, showing a process following the process shown in FIG. 31;

FIG. 33 is a diagram illustrating the method for manufacturing the magnetic head according to the present invention, showing a process following the process shown in FIG. 32;

FIG. 34 is a diagram illustrating the method for manufacturing the magnetic head according to the present invention, showing a process following the process shown in FIG. 33;

FIG. 35 is a diagram illustrating the method for manufacturing the magnetic head according to the present invention, showing a process following the process shown in FIG. 34;

FIG. 36 is a diagram illustrating the method for manufacturing the magnetic head according to the present invention, showing a process following the process shown in FIG. 35;

FIG. 37 is a diagram illustrating the method for manufacturing the magnetic head according to the present invention, showing a process following the process shown in FIG. 36;

FIG. 38 is a diagram illustrating the method for manufacturing the magnetic head according to the present invention, showing a process following the process shown in FIG. 37;

FIG. 39 is a diagram illustrating the method for manufacturing the magnetic head according to the present invention, showing a process following the process shown in FIG. 38;

FIG. 40 is a diagram illustrating the method for manufacturing the magnetic head according to the present invention, showing a process following the process shown in FIG. 39;

FIG. 41 is a diagram illustrating the method for manufacturing the magnetic head according to the present invention, showing a process following the process shown in FIG. 40;

FIG. 42 is a diagram illustrating the method for manufacturing the magnetic head according to the present invention, showing a process following the process shown in FIG. 41;

FIG. 43 is an enlarged perspective showing another example of an MR element;

FIG. 44 is a cross section along line 44—44 in FIG. 43

Figure 45:
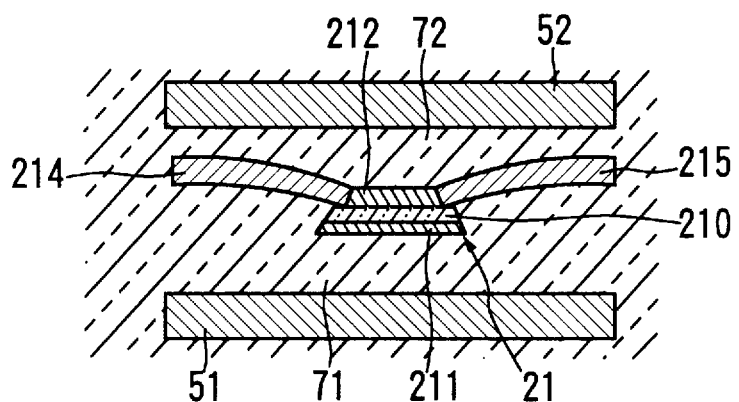
Figure 46:
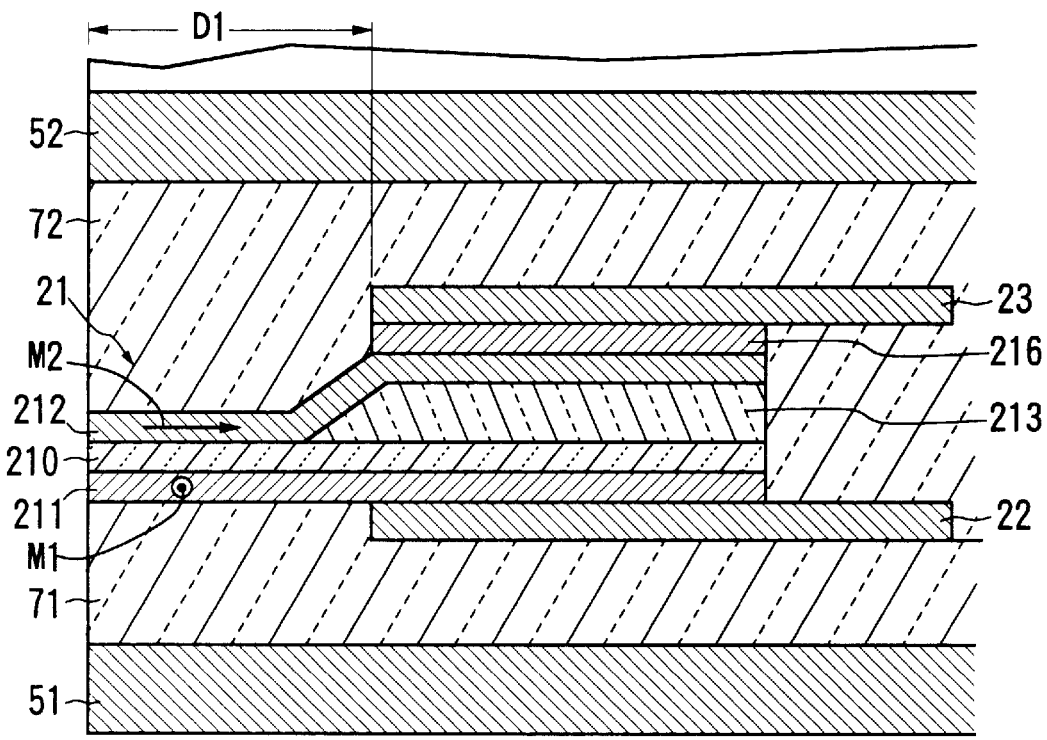
Figure 47:
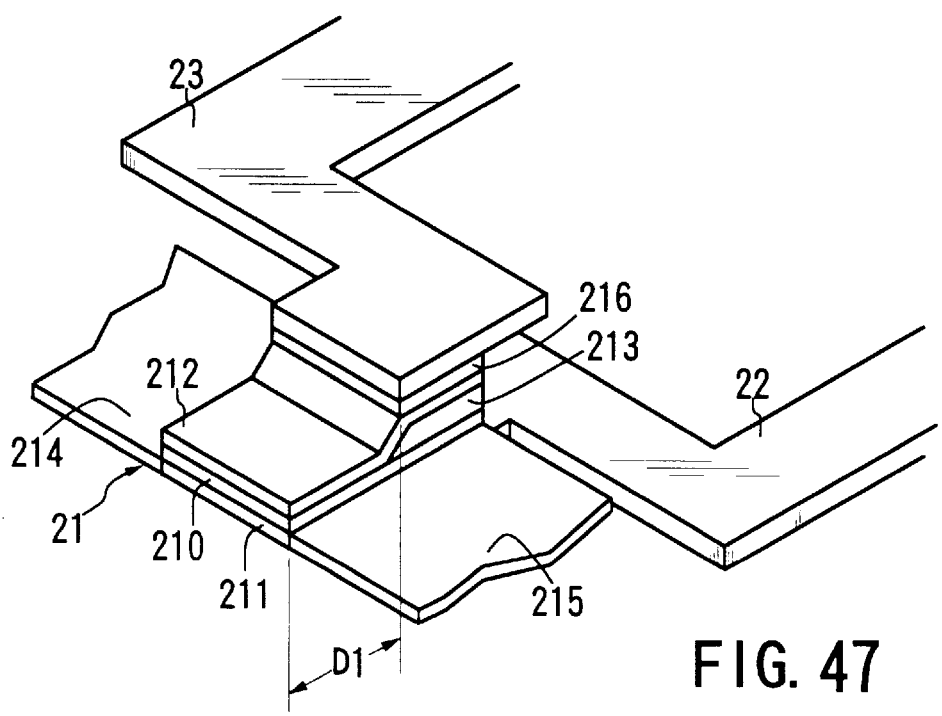
Figure 48:
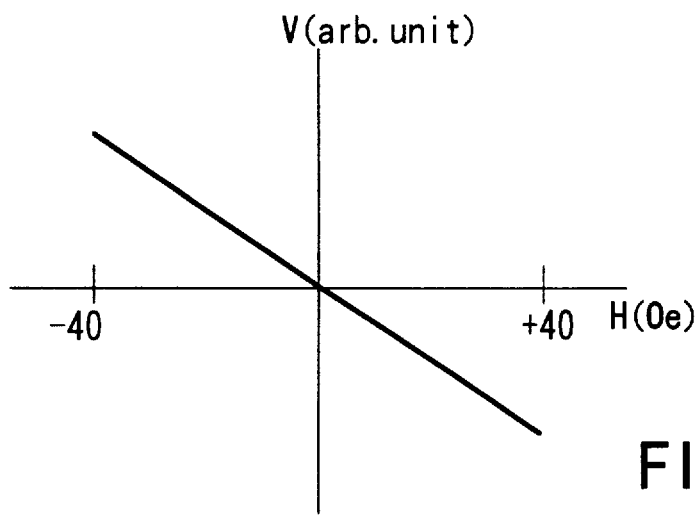
Figure 49:
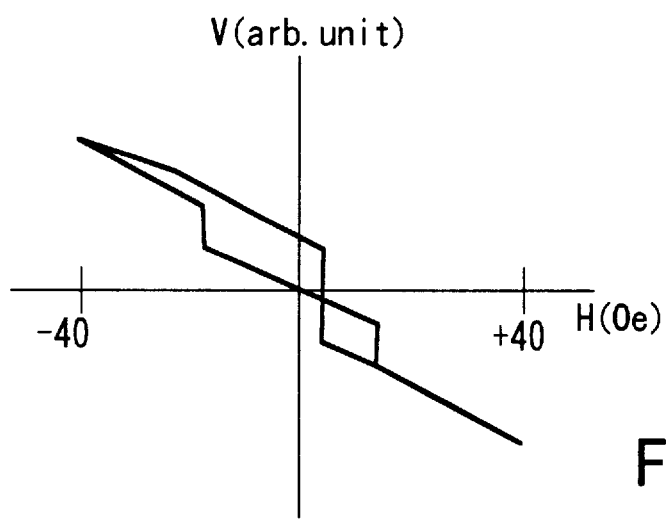
Figure 50:
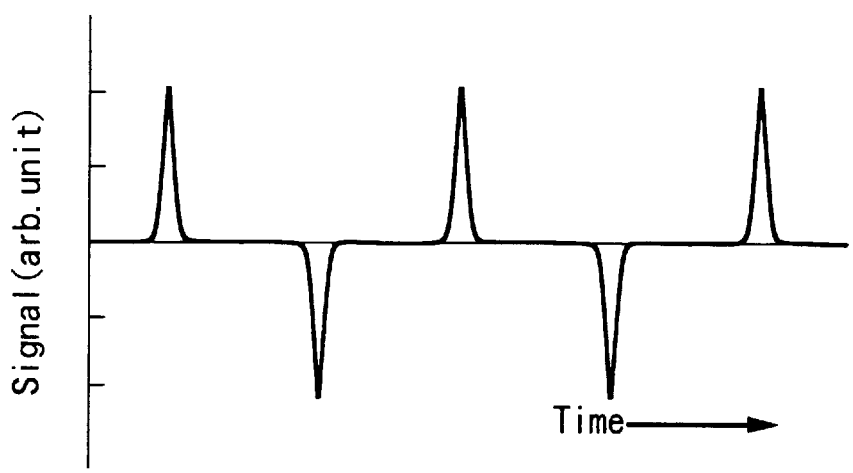
Figure 51:
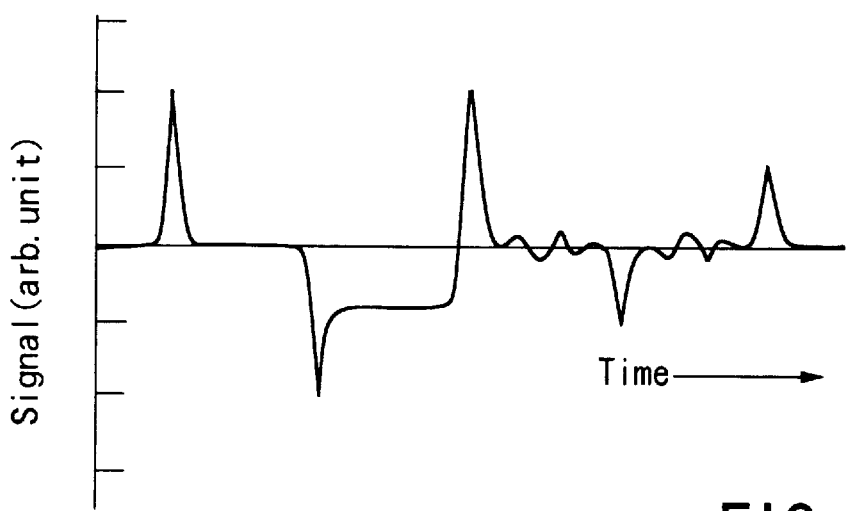
Figure 52:
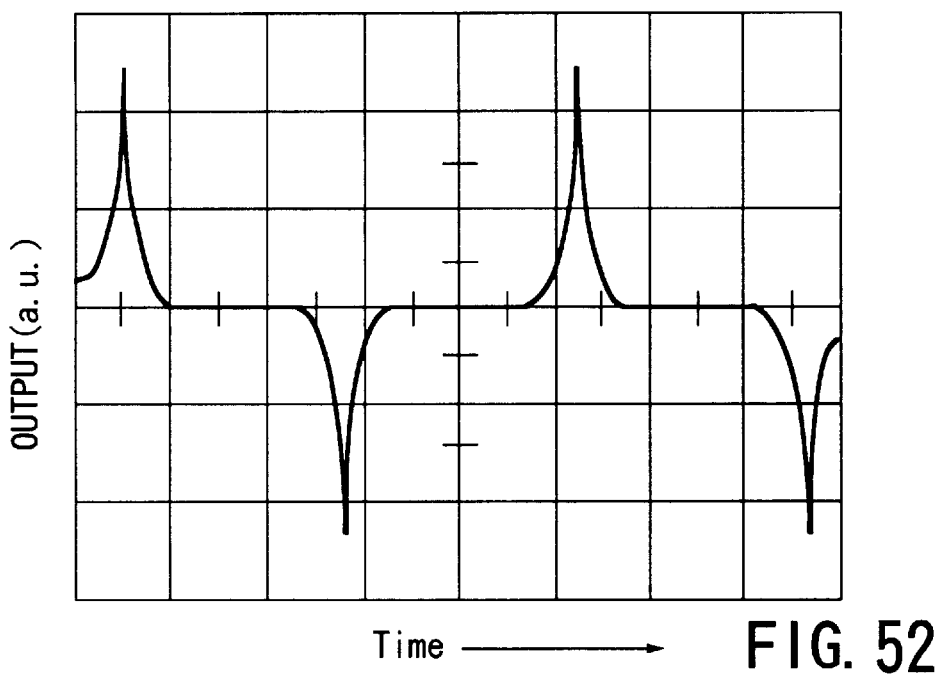

FIG. 45 is a cross section showing another example of an MR element;

FIG. 46 is a cross section of a ferromagnetic tunnel junction of the magnetic head according to the present invention FIG. 47 is an enlarged perspective of the ferromagnetic tunnel junction type magnetic conversion element shown in FIG. 46;

FIG. 48 shows the MR curve achieved by a magnetic head provided with magnetic domain control films;

FIG. 49 shows the MR curve achieved by a magnetic head without magnetic domain control films;

FIG. 50 shows the output waveform achieved by a magnetic head provided with magnetic domain control films;

FIG. 51 shows the output waveform achieved by a magnetic head without magnetic domain control films; and FIG. 52 shows the output waveform achieved by the magnetic head according to the present invention employing a ferromagnetic tunnel junction.

DETAILED DESCRIPTION OF THE PREFERRED EMBODIMENTS

Figure 1:
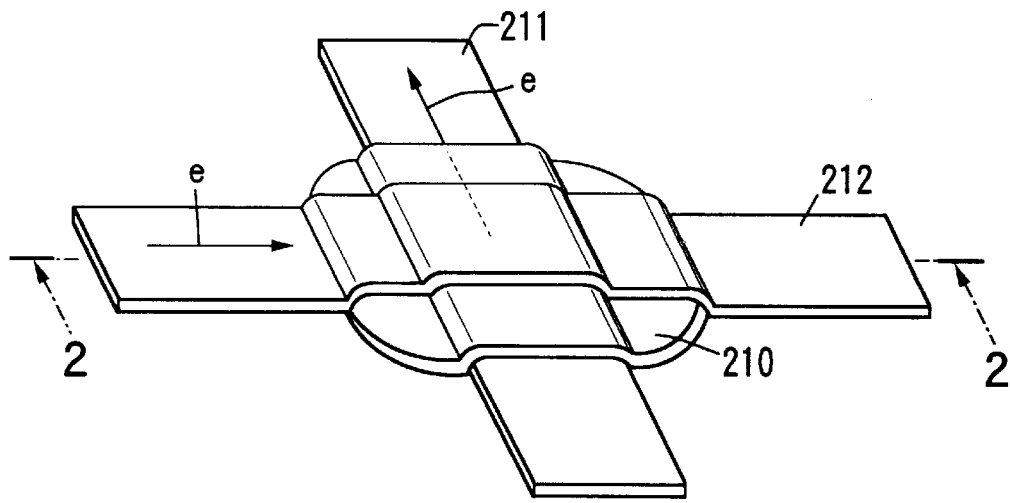
FIG. 1 is a perspective schematically illustrating the ferromagnetic tunnel junction according to the present invention.
Figure 2:
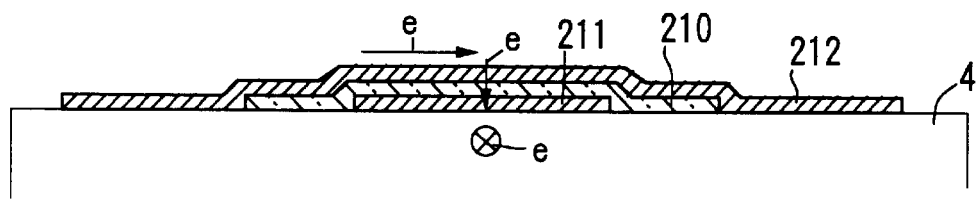
FIG. 2 is a cross section along line 2 to 2 in FIG. 1.

Referring to FIGS. 1 and 2, a ferromagnetic tunnel junction according to the present invention is constituted by sequentially laminating a first ferromagnetic film 211, an insulating film 210 and a second ferromagnetic film 212. These are laminated on an appropriate insulating substrate 4. The present invention is characterized in that the barrier potential of the insulating film 210 is set within a range of 0.5 to 3 eV.

In a ferromagnetic tunnel junction, when an electron e passes from the first ferromagnetic film 211 via the insulating film 210 through the second ferromagnetic film 212 while maintaining the direction of its spin (see FIGS. 1 and 2), the transmittance of the electron e is determined based upon the amplitude square ratio of the incident wave and the transmitted wave by using a wave function which is determined taking into consideration the spin. Its tunnel conductance G is expressed as:

$$G = G_0'(1 + P1' \cdot P2') \cos \theta$$

In this expression;

$$P1' = [(K1\uparrow - K1\downarrow)/((K1\uparrow + K1\downarrow)]\alpha 1$$

$$P2' = [(K2\uparrow - K2\downarrow)/((K2\uparrow + K2\downarrow)]\alpha 2$$

$G_0'$ : constant determined the wave number $K1\uparrow$, $K1\downarrow$, $K2\uparrow$, $K2\downarrow$ of the electron and the barrier potential level within the two ferromagnetic films $\alpha 1$, $\alpha 2$: coefficients that are dependent upon the barrier potential heights;

P1', P2': effective spin polarizations of the two ferromagnetic films 1 and 2 and P1', P2': spin polarizations (fractional portions in the effective spin polarizations P1', P2') of the two ferromagnetic films 1 and 2. The rate of change $\Delta G/G_0$ in tunnel conductance is expressed as;

$$\Delta G/G_0 = 2 \cdot P1' \cdot P2'$$

The meaning of the rate of change $\Delta G/G_0$ of the tunnel conductance is the same as that of the MR ratio.

Since, when the level of the barrier potential is small, the coefficients $\alpha 1$ and $\alpha 2$, which are dependent upon them, are low, resulting in small effective spin polarizations P1' and P2 in the two ferromagnetic films, the MR ratio is reduced. In contrast, if the barrier potential is sufficiently high, the effective spin polarizations P1' and P2' approach the spin polarizations P1 and P2, thereby achieving a high MR ratio.

In the case of the present invention, in which the barrier potential is set within the range of 0.5 to 3 eV, a high MR ratio is achieved while also achieving good reproduction characteristics. It is assumed that one of the reasons for this is that by maintaining the barrier potential within the range of 0.5 to 3 eV, formation of a consistent insulating film 210 with an extremely small number of pinholes is assured.

It is assumed that another contributing factor is a stable antiferromagnetically coupling between the first ferromagnetic film 211 and the second ferromagnetic film 212 via the insulating film 210 within the barrier potential range described above. Particularly advantageous results are achieved when the barrier potential is maintained within a range of 1.5 to 2.5 eV.

When the barrier potential exceeds 3 eV, a high MR ratio cannot be achieved. Although the reason for this is not yet clear, it is thought to be due to the fact that the tunnel current stops running when the barrier potential exceeds 3 eV.

When the barrier potential falls below 0.5 eV, a high MR ratio, which is expected of this type of ferromagnetic tunnel junction, cannot be achieved. The reason for this is thought to be degradation in the uniformity of the insulating film 210 with increasing the number of pinholes.

Now, the stable antiferromagnetically coupling formed between the first ferromagnetic film 211 and the second ferromagnetic film 212 via the insulating film 210 within the barrier potential range of 0.5 to 3 eV in this ferromagnetic tunnel junction offers a great advantage when it is adopted as a read magnetic conversion element in a magnetic head.

Figure 3:
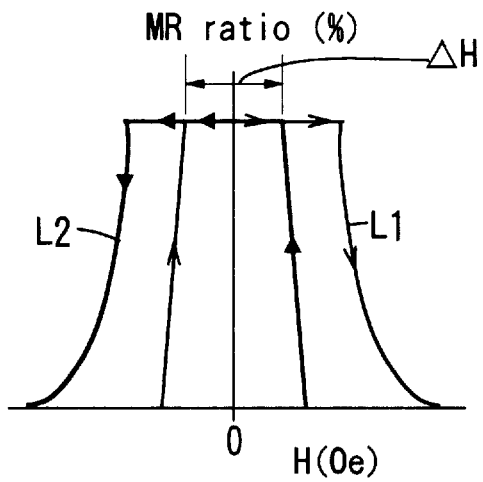
FIG. 3 shows the MR ratio characteristics in the ferromagnetic tunnel junction.

FIG. 3 shows the magnetic field-MR ratio characteristics when an antiferromagnetically coupling is formed. As shown in FIG. 3, when antiferromagnetically coupling is generated, the magnetic field-magnetoresistance curves L1 and L2 achieve the highest values for MR ratio in the area H in the vicinity of zero magnetic field. Consequently, when this ferromagnetic tunnel junction is employed for a magnetic conversion read element in a magnetic head, a linear area is obtained in the vicinity of the zero magnetic field simply as a shape effect without having to apply a bias magnetic field. Thus, the structure of the magnetic head can be simplified.

One example of the insulating film 210 with which a barrier potential as described above can be assured is an aluminum oxide film constituted by annealing in air at 40° to 100° C. With such an aluminum oxide film, since no metal-aluminum is partially present in the film, the upper and lower ferromagnetic layers 1 and 2 cannot be bridged electrically. As a result, a ferromagnetic tunnel junction provided with an ultra thin insulating film 210 with a high barrier potential is achieved.

As another example of the insulating film, a diamond-like carbon film (hereafter referred to as a DLC film) also achieves an ultra thin insulating film 210 with a high barrier potential. In particular, with a DLC film manufactured through the plasma CVD method, a good insulating film 210 with a high degree of uniformity and no pinholes is achieved even when the layer thickness is extremely small at several tens of angstrom.

It is to be noted that the C film constituting the intermediate layer disclosed by M. Pomerantz, J. C. Sloczewski, E. Spiller et.al. is an amorphous-C film manufactured through the MBE method and is different from a DLC film manufactured through the plasma CVD method. In more specific terms, while the amorphous-C film is constituted with carbon molecules coupling in a network, in the DLC film according to the present invention, carbon and hydrogen are coupled in the form of a network, thus the two films are essentially different from each other.

Figure 4:
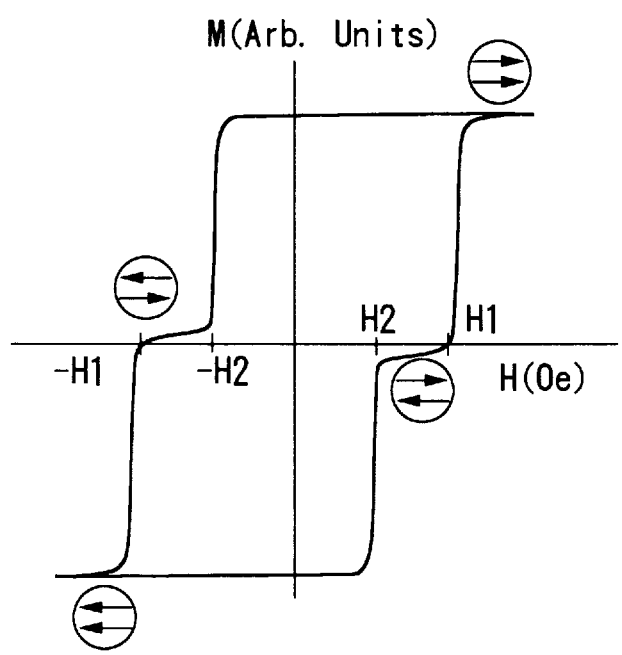
FIG. 4 shows the magnetization curves in the ferromagnetic tunnel junction.

According to the present invention, the coercivity of the first ferromagnetic film 211 and the coercivity of the second ferromagnetic film 212 are made to differ from each other. FIG. 4 shows the magnetization curve achieved when the coercivity H1 of the first ferromagnetic film 211 and the coercivity H2 of the second ferromagnetic film 212 are made to differ from each other to satisfy H1>H2 (or H2>H1). As shown in the figure, the magnetization curve forms a two-step loop. In FIG. 4, the two arrows within the circles indicate the direction of magnetization in the first ferromagnetic film 211 and the direction of magnetization in the second ferromagnetic film 212.

The direction of magnetization of the first ferromagnetic film 211 and the direction of magnetization of the second ferromagnetic film 212 are antiparallel to each other when the applied magnetic field is larger than the coercivity H2 (absolute value) and, at the same time, smaller than the coercivity H1 (absolute value), whereas they are parallel to each other when the applied magnetic field is larger than the coercivity H1. The electrical resistance increases when the directions of magnetization are in an antiparallel state and is reduced when the directions of magnetization are in a parallel state. With the resistance value achieved when the directions of magnetization are parallel to each other assigned Rs and the quantity of change in the resistance when the directions of magnetization shift from an antiparallel state to a parallel state assigned ΔR, the MR ratio is ΔR/Rs. With this, it becomes possible to detect an externally applied magnetic field.

Next, an explanation is given in reference to embodiments.

Embodiment 1

The ferromagnetic tunnel junction illustrated in FIGS. 1 and 2 was achieved by laminating a first ferromagnetic film 211 constituted of NiFe, an insulating film 210 constituted of an aluminum oxide film and a second ferromagnetic film 212 constituted of Co on an insulating substrate 4 constituted of a 3-inch diameter glass substrate. The insulating film 210, constituted of an aluminum oxide film, was formed by performing a 24-hour heat treatment on an aluminum film at 60° C. in air. The junction area of the ferromagnetic tunnel junction was 0.25 to 2500 $\mu m^2$.

Twenty ferromagnetic tunnel junctions were prepared, with each of the junction areas given above, and the barrier potential, the average value of the MR ratio and its deviation were checked for each junction area. In addition, the yield was also checked. Next, the method for producing the ferromagnetic tunnel junction is explained in a specific manner.

First, a NiFe film with a layer thickness of 10 nm was formed by RF sputtering to constitute the first ferromagnetic film 211 on the substrate 4 constituted of a 3-inch diameter Corning 7059 glass substrate, then by using fine machining technologies, such as resist photolithography, Ar ion milling and resist separation, patterning was performed to form 0.5 to 50 $\mu m \times 0.5$ to 50 $\mu m$ rectangles.

After this, resist patterning was performed and after removing the surface oxidized layer in the NiFe layer constituting the first ferromagnetic film 211 by sputter etching, an aluminum film with a film thickness of 5 nm was formed through the electron beam heating vacuum deposition method.

The sample was taken out of the vacuum deposition apparatus and then, after performing a heat treatment for 24 hours at 60° C. in air, it was formed into an insulating film 210 constituted of an aluminum oxide film with a diameter of 3 mm by using a lift-off process.

Next, after performing resist patterning again, a Co film with a layer thickness of 100 nm was formed to constitute the second ferromagnetic film 212 by RF sputtering and after that it was formed into the second ferromagnetic film 212 with a rectangular pattern of 0.5 to 50 $\mu m \times 0.5$ to 50 $\mu m$ in a direction perpendicular to the first ferromagnetic film 211 by using a lift-off process. Thus, a ferromagnetic tunnel junction with a junction area of 0.25 to 2500 $\mu m^2$ was obtained.

In addition, for purposes of comparison, a ferromagnetic tunnel junction constituted of NiFe/aluminum oxide/Co with a naturally oxidized aluminum film (left in the air for 24 hours after film formation), of the type normally used in the prior art, constituting the insulating film 210, was also prepared in a similar manner.

In the embodiment and in the Example for Comparison, film formation to prepare the first ferromagnetic film 211 and the second ferromagnetic film 212 employed was performed under the following conditions. In addition, the aluminum films were prepared with the ultimate pressure at $3 \times 10^{-5}$ Pa and the deposition speed at 0.05 nm/sec.

(Ferromagnetic layer film formation conditions)
Ultimate pressure : $1 \times 10^{-5}$ Pa
Target : $Ni_{80}Fe_{20}$ at %, Co (4-inch diameter)
Sputtering gas: Ar 5 sccm
Sputtering pressure : 0.5 Pa
Applied power: 150 W
Deposition rate: NiFe 45 nm/min, Co 40 nm/min
Substrate temperature: water cooled.

Of the samples that were prepared in this manner, their magnetoresistive (MR) curves were measured by employing the DC four-terminal method. It is to be noted that the maximum applied magnetic field during measurement was set at ±1kOe, and that after applying a −1kOe magnetic field, the magnetic field was gradually increased until it reached +1kOe before it was reset to −1kOe. In addition, the barrier potential was obtained by measuring the V-I characteristics of the tunnel junction and the deviation in the linear area was determined.

Figure 5:
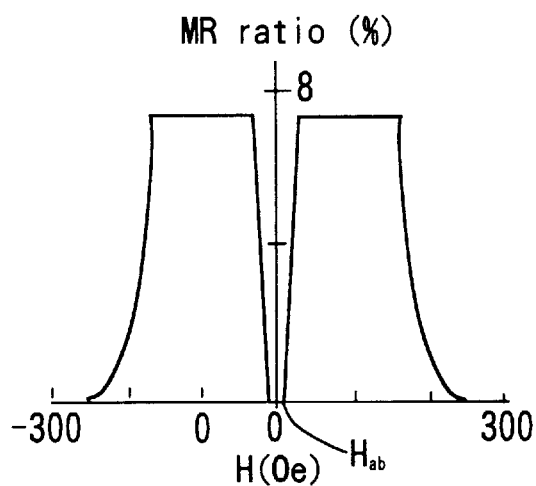
FIG. 5 shows the MR ratio characteristics in the ferromagnetic tunnel junction according to the present invention.

FIG. 5 shows a magnetoresistance curve of the ferromagnetic tunnel junction according to the present invention with a junction area of $50 \times 50$ $\mu m^2$. When the applied magnetic field is increased from −1kOe, magnetization reversal takes place at the first ferromagnetic film 211 at +50 e, causing the spins of the first ferromagnetic film 211 and the second ferromagnetic film 212 to become antiparallel, and resulting in an increase in the electrical resistance. The calculated barrier potential was at 0.5 eV, and a similar MR curve was obtained with 16 out of the 20 junctions prepared. The MR ratio was at 6.6 to 8.1% averaging 7.6% with a deviation in the ratio of 35 7%.

As for the ferromagnetic tunnel junction in the Example for Comparison employing the naturally oxidized aluminum film for its insulating film 210, a barrier potential of only 0.2 eV was achieved. In addition, an MR curve was observed only in 4 junctions, with low MR ratios, averaging only 1.5% with deviation from the average value extremely large at ±88%. A similar evaluation was performed on various junction sizes. The results are presented in Tables I-1 and I-2.

TABLE I-1

| ES | IF | JA ($\mu m^2$) | BP (eV) | MRR AV (%) | MRR DV (%) | YI (*) |
|---|---|---|---|---|---|---|
| 1-1 | TOA | 50 × 50 | 0.5 | 7.6 | ±7 | 16 |
| 1-2 | TOA | 20 × 20 | 1.0 | 7.5 | ±8 | 15 |
| 1-3 | TOA | 10 × 10 | 0.9 | 8.0 | ±6 | 16 |
| 1-4 | TOA | 5 × 5 | 0.7 | 7.9 | ±8 | 14 |
| 1-5 | TOA | 4 × 4 | 1.2 | 8.2 | ±10 | 14 |
| 1-6 | TOA | 3 × 3 | 1.5 | 8.4 | ±9 | 19 |
| 1-7 | TOA | 2 × 2 | 3.0 | 8.3 | ±11 | 15 |
| 1-8 | TOA | 1 × 1 | 2.5 | 8.3 | ±6 | 18 |
| 1-9 | TOA | 0.5 × 0.5 | 2.3 | 8.5 | ±10 | 19 |

TABLE I-2

| EC | IF | JA ($\mu m^2$) | BP (eV) | MRR AV (%) | MRR DV (%) | YI (*) |
|---|---|---|---|---|---|---|
| 1-1 | NOA | 50 × 50 | 0.2 | 1.5 | ±88 | 4 |
| 1-2 | NOA | 20 × 20 | 0.2 | 1.6 | ±78 | 5 |
| 1-3 | NOA | 10 × 10 | 0.05 | 1.5 | ±75 | 4 |
| 1-4 | NOA | 5 × 5 | 0.2 | 1.7 | ±80 | 6 |
| 1-5 | NOA | 4 × 4 | 0.1 | 1.8 | ±65 | 6 |
| 1-6 | NOA | 3 × 3 | 0.2 | 1.5 | ±72 | 6 |

TABLE I-2-continued

| EC | IF | JA ($\mu m^2$) | BP (eV) | MRR AV (%) | MRR DV (%) | YI (*) |
|---|---|---|---|---|---|---|
| 1-7 | NOA | 2 × 2 | 0.3 | 2.2 | ±74 | 7 |
| 1-8 | NOA | 1 × 1 | 0.1 | 1.8 | ±70 | 5 |
| 1-9 | NOA | 0.5 × 0.5 | 0.3 | 2.0 | ±85 | 6 |

In Table I-1:
ES; Embodiment sample
IF; Insulating film (heat treated at 60° C.)
JA; Junction area ($\mu m^2$)
BP; Barrier potential (eV)
MRR; MR ratio
AV; Average value (%)
DV; Deviation (%)
YI: Yield (quantity)
TOA; Thermally oxidized aluminum film
(*) number of ferromagnetic tunnel junctions out of 20 with which good MR characteristics were achieved.

In Table I-2
EC; Example for Comparison sample
IF; Insulating film (left in air)
JA; Junction area ($\mu m^2$)
BP; Barrier potential (eV)
MRR; MR ratio
AV; Average value (%)
DV; Deviation (%)
YI ; Yield (quantity)
NOA; Naturally oxidized aluminum film
(*) : number of ferromagnetic tunnel junctions out of 20 with which good MR characteristics were achieved.

As Table I clearly indicates, by employing aluminum oxide film formed through heat treatment at 60° C. in air as the insulating film 210, a high barrier potential of 0.5 to 3 eV and a high MR ratio are obtained with a very little deviation, and a high yield is achieved. The yield is particularly high when the barrier potential is within the range of 1.5 to 2.5 eV. In addition, the results of an examination of the MR characteristics in the ferromagnetic tunnel junction which employs an aluminum oxide film achieved through heat treatment in air within a temperature range of 30° to 250° C. for the insulating film 210, demonstrate that a high MR ratio is achieved, with little deviation and a high yield when the heat treatment is performed at 40° to 100° C.

Embodiment 2

A ferromagnetic tunnel junction with its insulating film 210 constituted of a DLC film was formed on a substrate 4 constituted of a glass substrate. The first ferromagnetic film 211 was constituted of $Co_{50}Fe_{50}$, whereas the second ferromagnetic film 212 was constituted of Co. The junction area was set at 0.25 to 2500 $\mu m^2$. The first ferromagnetic film 211 and the second ferromagnetic film 212 were prepared in a method identical to that employed in Embodiment 1. The DLC film constituting the insulating film 210 was formed through a plasma CVD method to achieve a layer thickness of 5 nm and a diameter of 3 mm, and patterning was performed employing the lift-off method. The conditions under which the DLC film was formed are listed below.
(DLC film formation conditions)
Ultimate pressure : $2 \times 10^{-3}$ Pa Introduced gas : methane 5 sccm
Gas pressure : 3.5 Pa
RF power: 50 W
Self bias voltage: −150 V
Deposition rate : 10 nm/min
Substrate temperature: no heating and no water cooling.

In addition, as an example for comparison, a $Co_5Fe_{50}$/aluminum oxide/Co ferromagnetic tunnel junction employing a naturally oxidized aluminum film for its insulating film 210 was prepared.

The results obtained when the samples in the embodiment and the example for comparison described above were measured to determine their MR characteristics by employing the DC 4-terminal method are presented in Tables II-1 and II-2.

TABLE II-1

| ES | IF | JA ($\mu m^2$) | BP (eV) | MRR AV (%) | MRR DV (%) | YI (*) |
|---|---|---|---|---|---|---|
| 2-1 | DLC | 50 × 50 | 1.2 | 18.9 | ±12 | 15 |
| 2-2 | DLC | 20 × 20 | 1.0 | 18.5 | ±15 | 15 |
| 2-3 | DLC | 10 × 10 | 0.8 | 18.1 | ±13 | 16 |
| 2-4 | DLC | 5 × 5 | 1.0 | 19.0 | ±16 | 14 |
| 2-5 | DLC | 4 × 4 | 1.2 | 19.8 | ±12 | 14 |
| 2-6 | DLC | 3 × 3 | 1.5 | 20.4 | ±12 | 18 |
| 2-7 | DLC | 2 × 2 | 1.8 | 20.3 | ±11 | 19 |
| 2-8 | DLC | 1 × 1 | 2.7 | 19.3 | ±11 | 15 |
| 2-9 | DLC | 0.5 × 0.5 | 2.3 | 20.5 | ±10 | 19 |

TABLE II-2

| EC | IF | JA ($\mu m^2$) | BP (eV) | MRR AV (%) | MRR DV (%) | YI (*) |
|---|---|---|---|---|---|---|
| 2-1 | NOA | 50 × 50 | 0.2 | 3.3 | ±82 | 5 |
| 2-2 | NOA | 20 × 20 | 0.2 | 1.6 | ±75 | 6 |
| 2-3 | NOA | 10 × 10 | 0.1 | 1.5 | ±60 | 5 |
| 2-4 | NOA | 5 × 5 | 0.2 | 1.7 | ±55 | 4 |
| 2-5 | NOA | 4 × 4 | 0.05 | 1.8 | ±77 | 5 |
| 2-6 | NOA | 3 × 3 | 0.1 | 1.5 | ±55 | 6 |
| 2-7 | NOA | 2 × 2 | 0.4 | 2.2 | ±60 | 6 |
| 2-8 | NOA | 1 × 1 | 0.3 | 1.8 | ±70 | 7 |
| 2-9 | NOA | 0.5 × 0.5 | 0.4 | 2.0 | ±60 | 7 |

In Table II-1:
ES; Embodiment sample
IF; Insulating film
JA; Junction area ($\mu m^2$)
BP; Barrier potential (eV)
MRR; MR ratio
AV ; Average value (%)
DV; Deviation (%)
YI ; Yield
(*) ; number of ferromagnetic tunnel junctions out of 20 with which good MR characteristics were achieved.
IN Table II-2
EC; Example for Comparison sample
IF; Insulating film
JA; Junction area ($\mu m^2$)
BP ; Barrier potential (eV)
MRR; MR ratio
AV; Average value (%)
DV; Deviation (%)
YI ; Yield (quantity)
NOA; Naturally oxidized aluminum film
(*) ; number of ferromagnetic tunnel junctions out of 20 with which good MR characteristics were achieved.

As Table II clearly indicates, by using the DLC film prepared through the plasma CVD method as the insulating film 210, a high barrier potential and a high MR ratio are obtained with very little deviation and high yield.

For instance, of the 20 samples prepared with the junction area at 50×50 $\mu m^2$ in this embodiment, a good MR curve was achieved in 15 samples. The average value for the MR ratio was at 18.9% with the deviation of the ratio at ±12%. In addition, as in Embodiment 1, the yield was particularly high with the barrier potential at 1.5 to 2.5 eV. In comparison, in the ferromagnetic tunnel junction in the example for comparison which employed a naturally oxidized aluminum film for its insulating film 210, the barrier potential was low overall, with only 5 samples demonstrating an MR curve and the MR ratio average value was low at 3.3% with the deviation very large at ±88%.

Next, the relationship between the junction area and the magnetization reversal field is explained. It has been reported that the smaller the junction area is, the fewer defects such as pinholes in the insulating film 210 result, achieving a higher yield. As Tables I and II indicate, a higher MR ratio and a higher yield are achieved as the junction area is reduced in the ferromagnetic tunnel junction in these embodiments. In particular, with the barrier potential within a range of 1.5 to 2.5 eV, the yield becomes higher. In addition, it has been learned that the magnetic field Hab shown in FIG. 5, i.e., the magnetic field where the magnetization of the first ferromagnetic film 211 becomes reversed, shifts in the negative direction. In particular, when the junction area is smaller than 10 $\mu m^2$ and the barrier potential is at 1.5 to 2.5 eV, the magnetizations of the first ferromagnetic film 211 and the second ferromagnetic film 212 are antiparallel at zero magnetic field. This indicates that an antiferromagnetically coupling force is induced between the two magnetic layers. It is assumed that a high MR ratio and a high yield were achieved when the junction area was smaller than 10 $\mu m^2$ because antiferromagnetically coupling was induced between the two magnetic layers by employing an insulating film 210 with a high degree of uniformity and very few pinholes and also by reducing the junction area. In addition, as embodiment 1 to 7 and embodiment 2 to 8 demonstrate, if the barrier potential is greater than 2.5 eV, even when the junction area is less than 10 $\mu m^2$, no antiferromagnetically coupling is achieved between the two magnetic layers and the yield, too, is somewhat reduced.

According to the ferromagnetic tunnel junction illustrated in FIGS. 1 and 2, it is obvious to provide an MR element that can achieve a high MR ratio while also achieving simplification of the structure. Next, specific examples of the MR element according to the present invention are explained.

Figure 6:
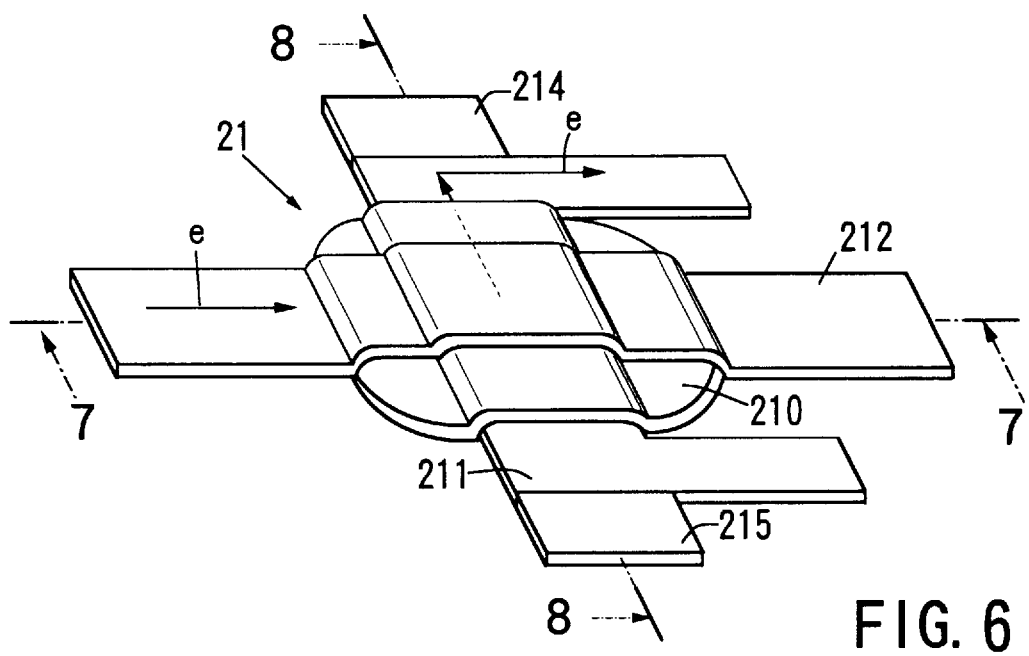
FIG. 6 is a perspective schematically showing the MR element according to the present invention.
Figure 7:
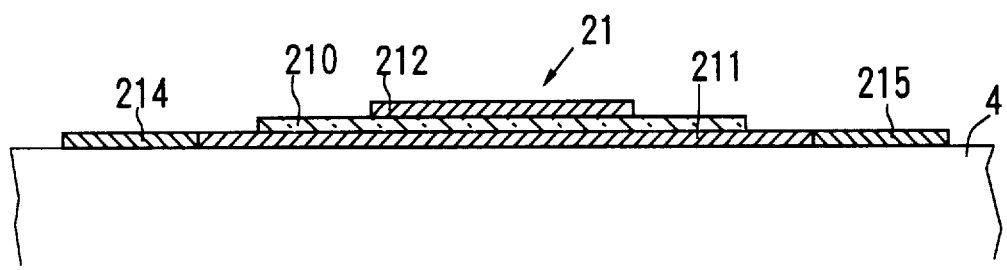
FIG. 7 is a cross section along line 8—8 in FIG. 6.
Figure 8:
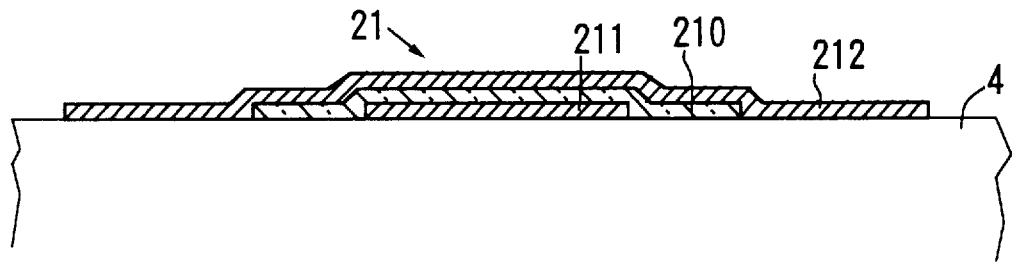
FIG. 8 is a cross section along line 7—7 in FIG. 6.

FIG. 6 is a schematic perspective of the MR element according to the present invention, FIG. 7 is a cross section along line 8—8 in FIG. 6 and FIG. 8 is a cross section along line 7—7 in FIG. 6. As shown in the figures, the MR element according to the present invention is provided with a ferromagnetic tunnel junction 21 and magnetic domain control films 214 and 215. The ferromagnetic tunnel junction 21 includes an insulating film 210, a first ferromagnetic film 211 and a second ferromagnetic film 212. The first ferromagnetic film 211 and the second ferromagnetic film 212 are laminated at either side of the insulating film 210. These are laminated on an appropriate insulating support base 4. The magnetic domain control films 214 and 215 are provided adjacent to the two end portions of the first ferromagnetic film 211. An explanation is given in reference to this embodiment of a structure in which the first ferromagnetic film 211 is made to constitute a free ferromagnetic film whose direction of magnetization changes freely relative to a weak external magnetic field and the second ferromagnetic film 212 is made to constitute a pinned ferromagnetic film whose direction of magnetization remains unchanged relative to a weak external magnetic field.

(Magnetic domain control)

In this type of MR element, the ferromagnetic tunnel junction 21 is formed as a fine rectangular pattern. In such a pattern, a magnetically unstable region is formed at the end portions of the pattern resulting in the formation of a magnetic domain. This causes a partial magnetization reversal to occur in the magnetic domain wall motion mode, generating noise. To deal with this problem, the magnetic domain control films 214 and 215 are formed at the two end portions of the first ferromagnetic film 211 in order to impose a single magnetic domain on the first ferromagnetic film 211. The magnetic domain control films 214 and 215 in this embodiment are magnetic bias films.

Figure 9:
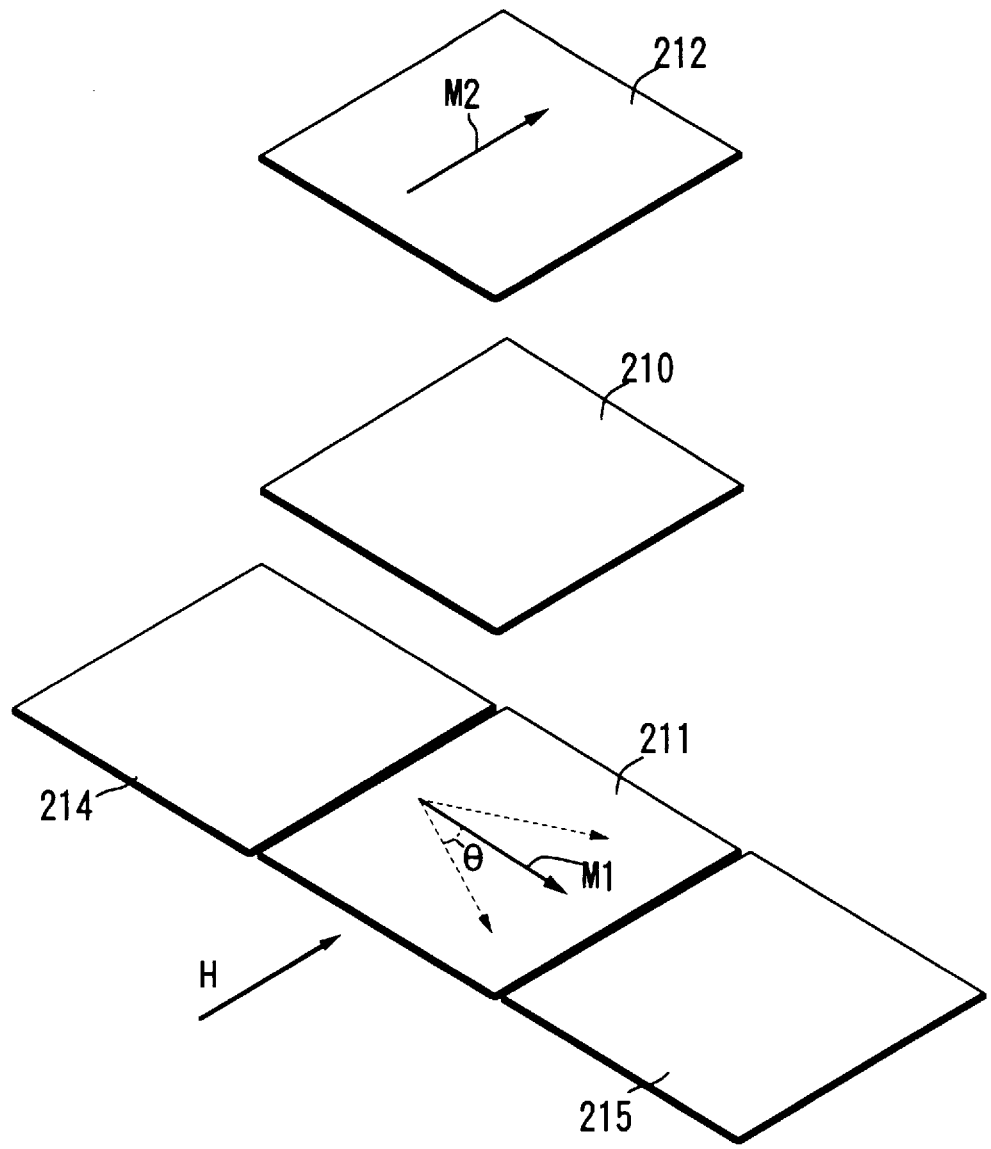
FIG. 9 is a diagram illustrating the operation of the tunnel junction portion in the MR element shown in FIGS. 6 to 8.

FIG. 9 illustrates the operation of the tunnel junction portion in the MR element shown in FIGS. 6 to 8 It is assumed that when the applied magnetic field H is at zero, the direction of magnetization M2 of the second ferromagnetic film 212 is pinned in a direction parallel to the magnetic field H to be applied. The direction of magnetization M1 of the first ferromagnetic film 211 is controlled so that it is set in a direction perpendicular to the magnetic field H to be applied by the magnetic domain control films 214 and 215. When the magnetic field H is applied by a magnetic recording medium such as a magnetic disk in this state, the direction of magnetization M1 of the first ferromagnetic film 211 changes by, for instance, an angle θ, while the direction of magnetization M2 of the pinned second ferromagnetic film 212 remains unchanged. Thus, the magnetoresistance effect is generated.

With such magnetic domain control films 214 and 215 provided adjacent to the two end portions of the first ferromagnetic film 211, there is no room between the first ferromagnetic film 211 and the second ferromagnetic film 212 where an electric short could occur. As a result, a sufficiently large tunnel current can be supplied to the ferromagnetic tunnel junction 21. Thus, a large MR ratio is achieved.

Furthermore, the first ferromagnetic film 211 provided with the magnetic domain control films 214 and 215 can be set in a state of single magnetic domain. This prevents generation of Barkhausen noise which causes distortion in the output waveform, thereby achieving noiseless, stable output.

Hard ferromagnetic films or antiferromagnetic films may be used to constitute the magnetic domain control films 214 and 215. It is desirable to use hard ferromagnetic films with a coercivity equal to or greater than 1kOe to constitute the magnetic domain control films 214 and 215 in order to prevent a disturbing influence of an external magnetic field. There are no specific restrictions imposed upon the film thickness of the hard ferromagnetic films or the material used to constitute them. However, it is necessary that the product t·Br of the film thickness t of the hard ferromagnetic film and the residual magnetic flux density Br be at a specific level in order to generate a bias magnetic field of a specific magnitude. Because of this, it is desirable to use a Co alloy to constitute them and, in particular, CoPt, CoPtCr, CoPtTa, CoCrTa, CoPtTaCr and the like are preferred since high coercivity is achieved even when the film thickness is small.

In addition, a base layer may be formed in order to increase the coercivity of these hard ferromagnetic films. The hard ferromagnetic films each has a close-packed hexagonal crystalline structure with the magnetic easy axis being the C axis. Thus, it is desirable to set the C axis in an in-plane direction to efficiently apply a bias magnetic field in a direction within the plane of the films and in this case, some type of buffer layer may be provided. By forming a buffer layer, the coercivity can be further increased. It is desirable to constitute the buffer layer with a material whose lattice constant is approximately the same as that of the Co alloy used for the ferromagnetic films and, in particular, Cr, Mo, W, Ta, Zr and alloys thereof are desirable because of their body-centered cubic structure.

When antiferromagnetic films are used to constitute the magnetic domain control films 214 and 215, an exchange bias magnetic field is generated through exchange coupling with the first ferromagnetic film 211. In order to generate a large exchange bias magnetic field, it is essential that a high degree of flatness is achieved at the interface of the ferromagnetic layer and the antiferromagnetic layer and that the formation of a mixing layer be prevented.

Figure 10:
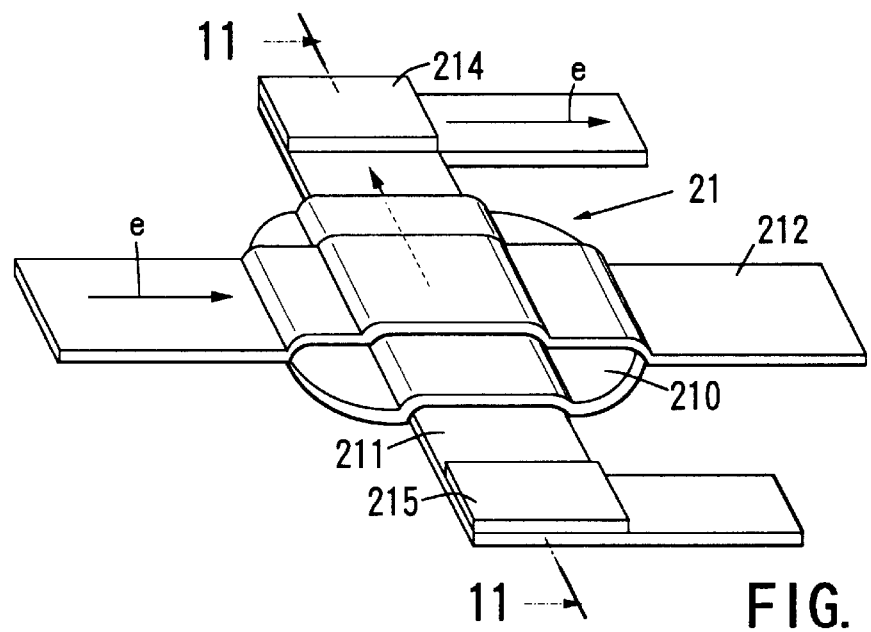
FIG. 10 is a perspective schematically showing another embodiment of the MR element according to the present invention.
Figure 11:
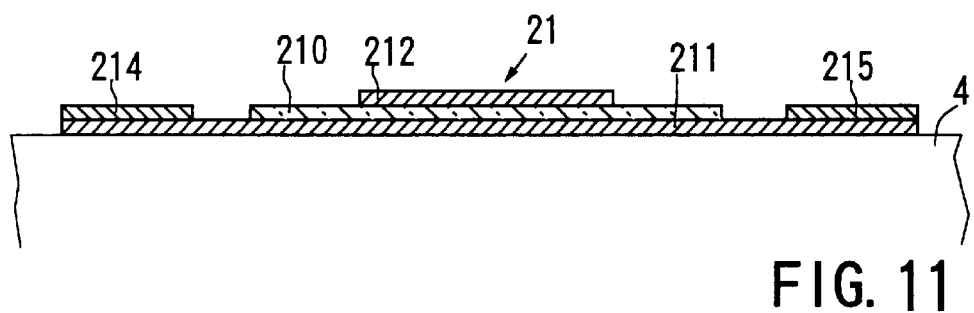
FIG. 11 is a cross section along line 11—11 in FIG. 10
Figure 12:
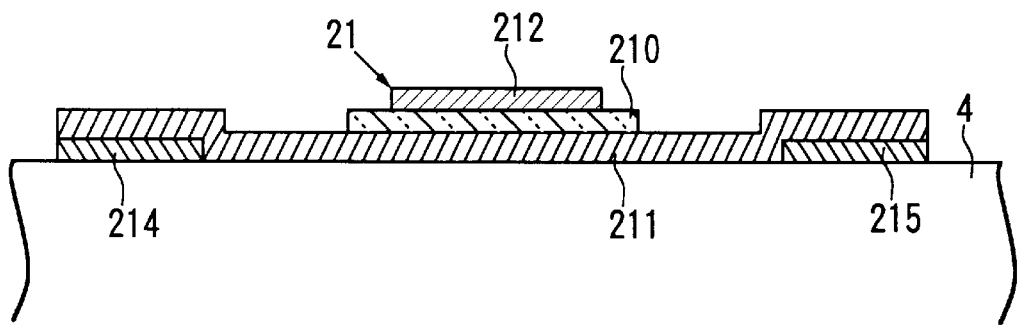
FIG. 12 is a cross section schematically showing another embodiment of the MR element according to the present invention.

The antiferromagnetic materials that may be used include metallic materials and oxide materials. Desirable metallic antiferromagnetic materials include Mn alloys such as FeMn and NiMn and Cr alloys such as CrAl and CrSb. Desirable oxide ferromagnetic materials include NiO, CoO and $Fe_2O_3$. The most desirable is an Mn antiferromagnetic material since it achieves a large exchange bias magnetic field. However, there are alloys that can be only obtained through epitaxial growth on a ferromagnetic film with a face-centered cubic structure such as NiFe among Mn alloys, and if such an alloy is used, it is desirable to employ a structure in which the magnetic domain control films 214 and 215 constituted of the antiferromagnetic films be provided on and in contact with the first ferromagnetic film 211 of the ferromagnetic tunnel junction 21 which should be set in a state of single magnetic domain, as shown in FIGS. 10 and 11. Alternatively, as shown in FIG. 12, the first ferromagnetic film 211 may be provided on the magnetic domain control films 214 and 215.

(Means for magnetization pinning)

The magnetoresistance change at the ferromagnetic tunnel junction 21 is dependent upon the relative angle formed by the directions of magnetization of the first ferromagnetic film 211 and the second ferromagnetic film 212. Consequently, in order to achieve a high output and a waveform with good symmetry with a very small magnetic field, as is required in a magnetic head, it is desirable that the direction of magnetization M1 of the first ferromagnetic film 211 and the direction of magnetization M2 of the second ferromagnetic film 212 are not parallel to each other when the applied external magnetic field is at zero.

The following two means may be employed to set the directions so that the magnetic easy axis of the first ferromagnetic film 211, i.e., the free ferromagnetic film, is perpendicular to the external magnetic field and the magnetic easy axis of the second ferromagnetic film 212, i.e., the pinned ferromagnetic film, is parallel to the external magnetic field.

In the first means for magnetization pinning, a soft ferromagnetic film with low coercivity is used to constitute the first ferromagnetic film 211, i.e., the free ferromagnetic film and a hard magnetic film with high coercivity is used to constitute the second ferromagnetic film 212, i.e., the pinned ferromagnetic film.

Figure 13:
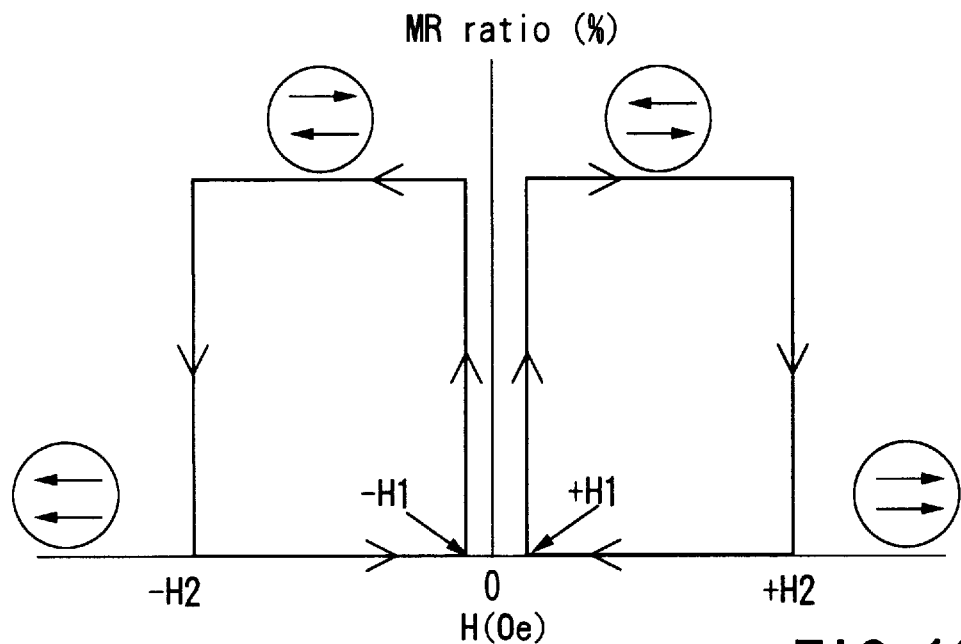
FIG. 13 shows the magnetic field-MR ratio characteristics achieved when a soft ferromagnetic film with low coercivity is employed to constitute the free ferromagnetic film and when a hard ferromagnetic film with high coercivity is used to constitute the pinned ferromagnetic film.

FIG. 13 shows the magnetic field-magnetoresistance (MR) ratio characteristics that are achieved when the first means for magnetization pinning is employed, i.e., when a soft ferromagnetic film with low coercivity is used to constitute the free ferromagnetic film and a hard ferromagnetic film with high coercivity is used to constitute the pinned ferromagnetic film. In FIG. 13, the two arrows shown in the circles indicate the direction of magnetization of the first ferromagnetic film 211 and the direction of magnetization of the second ferromagnetic film 212. When the applied magnetic field H is gradually increased starting at a value that is lower than the magnetic field level (−H2), a magnetization reversal of the free ferromagnetic film 211 with low coercivity occurs at a magnetic field level (+H1). When the applied magnetic field H is further increased, magnetization reversal of the pinned ferromagnetic film 212 with high coercivity occurs at a magnetic field level (+H2). Likewise, when the applied magnetic field H is gradually reduced starting at a value higher than the magnetic field level H2, the magnetization of the ferromagnetic films 211 and 212 are reversed respectively at the magnetic field level (−H1) and the magnetic field level (−H2).

In a range over which the applied magnetic field H satisfies $|H1|<H<|H2|$, the direction of magnetization of the first ferromagnetic film 211 and the direction of magnetization of the second ferromagnetic film 212 are antiparallel to each other, whereas in the range over which the applied magnetic field H satisfies $|H1|>H$ and $H>|H2|$, the directions of their magnetization are parallel to each other. The electric resistance is high when the directions of magnetization are in an antiparallel state and is low when the directions of magnetization are in a parallel state. The ratio of the resistance value Rs when the directions of magnetization are parallel and the change $\Delta R$ in the resistance which occurs when the state of the directions of magnetization changes from antiparallel to parallel constitutes the MR ratio, and with this, an externally applied magnetic field can be detected.

Figure 14:
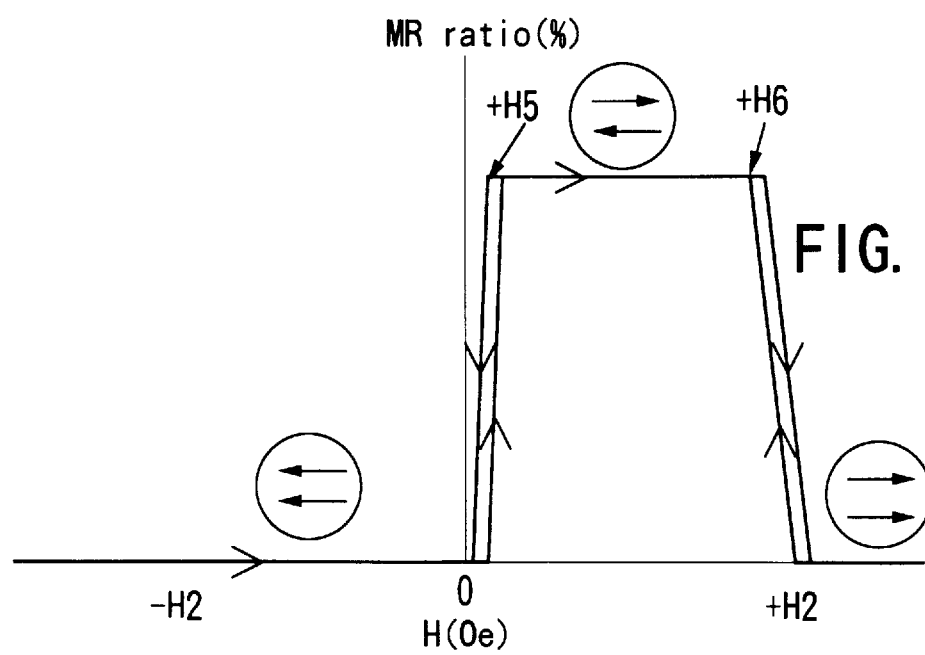
FIG. 14 shows the magnetic field-MR ratio characteristics achieved when a soft ferromagnetic film is employed to constitute both the free ferromagnetic film and the pinned ferromagnetic film with a magnetization pinning film laminated adjacent to the pinned ferromagnetic film.

In the second means for magnetization pinning, both the first ferromagnetic film 211 and the second ferromagnetic film 212 are constituted of a soft ferromagnetic film, with a magnetization pinning film laminated on the second ferromagnetic film 212, which will constitute the pinned ferromagnetic film, to pin the direction of magnetization of the second ferromagnetic film 212. FIG. 14 shows the magnetic field-MR ratio characteristics achieved when the second means for magnetization pinning is employed, i.e., when a soft ferromagnetic film is used to constitute both the free ferromagnetic film and the pinned ferromagnetic film with the magnetization pinning film laminated adjacent to the pinned ferromagnetic film. Magnetization reversal occurs only at the free ferromagnetic film when the magnetic field is approximately zero and the magnetization of the pinned ferromagnetic film, which is exchange coupled with the magnetization pinning film is not reversed. When the magnetic field is increased further until pinning effect can no longer remain in effect through exchange coupling, magnetization reversal occurs for the pinned ferromagnetic film as well. In this case, a high MR ratio is achieved with the magnetic field H in a range of +H5<H<+H6.

Next, a specific example of the means for magnetization pinning which satisfies the requirements described above is explained.

Either a hard ferromagnetic film with high coercivity or an antiferromagnetic film may be used to constitute the magnetization pinning film 216. When a hard ferromagnetic film is used to constitute the magnetization pinning film 216, exchange coupling through the ferromagnetic film-ferromagnetic film is generated between the magnetization pinning film 216 and the second ferromagnetic film 212, pinning the direction of magnetization of the second ferromagnetic film 212 so that it becomes a pinned ferromagnetic film. When an antiferromagnetic film is used to constitute the magnetization pinning film 216, exchange coupling through the antiferromagnetic film-ferromagnetic film is generated between the magnetiation pinning film 216 and the second ferromagnetic film 212 , thereby pinning the direction of magnetization of the second ferromagnetic film 212 so that it becomes a pinned ferromagnetic film.

A Co alloy such as CoPt, CoPtCr, CoPtTa, CoCrTa, CoPtTaCr or the like may be employed to constitute the hard ferromagnetic film. A metallic antiferromagnetic material or an oxide antiferromagnetic material may be employed to constitute the antiferromagnetic film. An example of the metallic antiferromagnetic material is an Mn alloy. Mn alloys that may be used in this application include FeMn, NiMn, PtMn, RuMn, RhMn, IrMn, PdMn and combinations thereof. Examples of the oxide antiferromagnetic material that may be employed include NiO, NiCoO, $Fe_2O_3$ and CoO.

Figure 15:
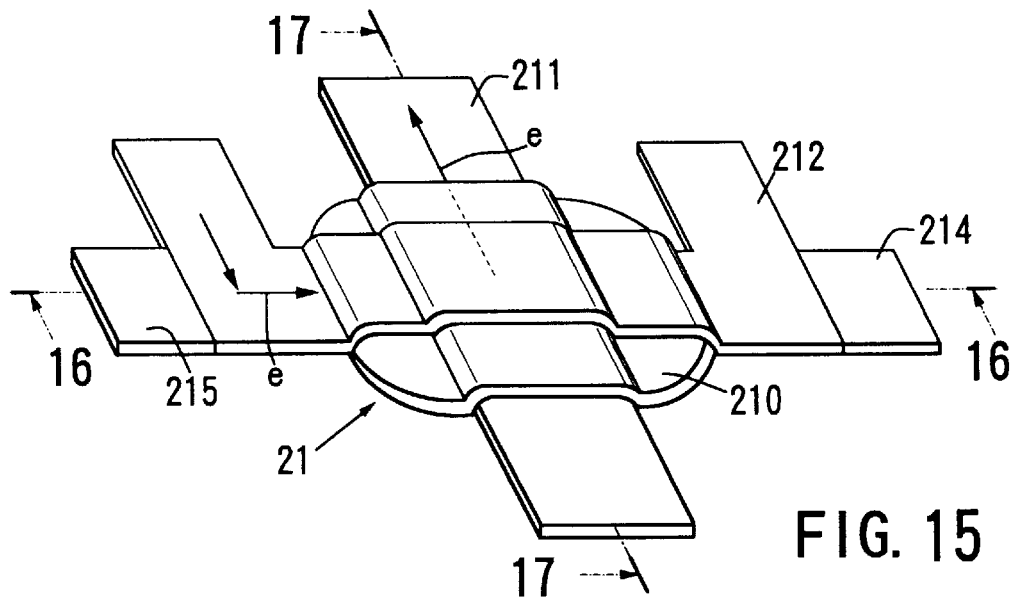
FIG. 15 is a cross section showing another example of the ferromagnetic tunnel junction in the MR element according to the present invention.
Figure 16:
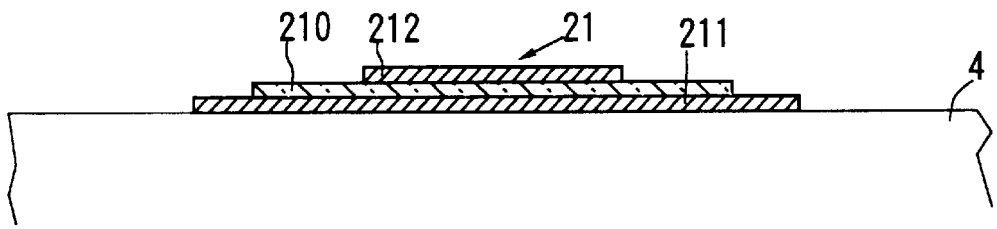
FIG. 16 is a cross section along line 17—17 in FIG. 15.
Figure 17:
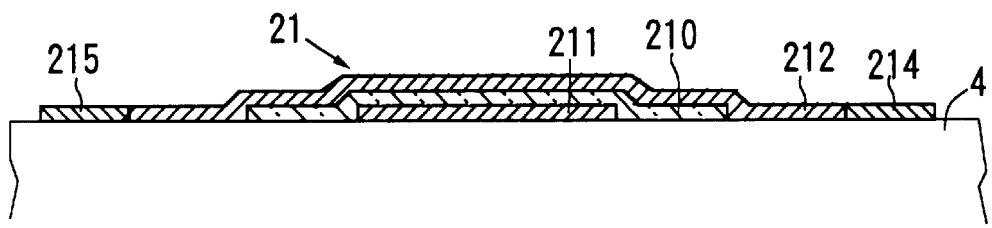
FIG. 17 is a cross section along line 16—16 in FIG. 15.
Figure 18:
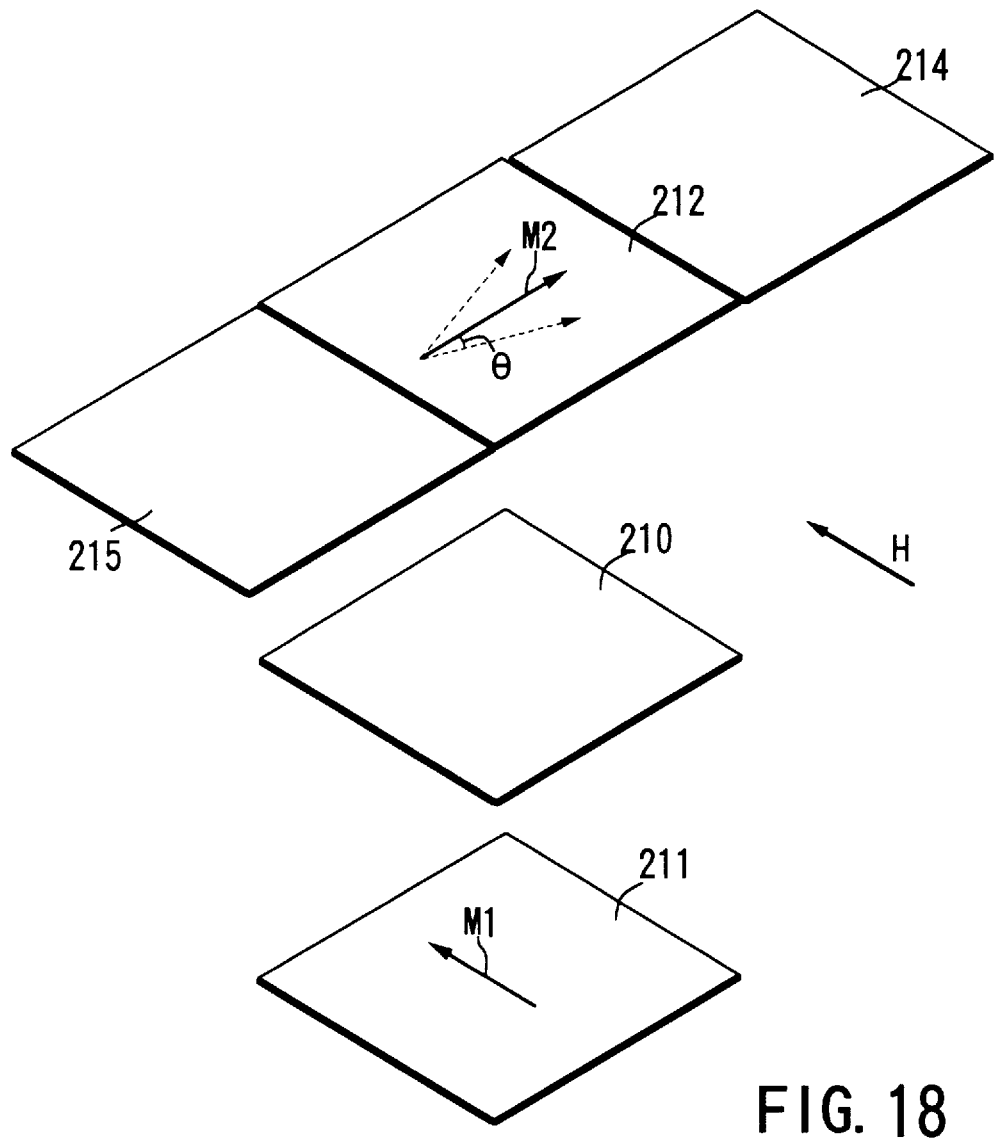
FIG. 18 is a diagram illustrating the operation of the tunnel junction portion in the MR element shown in FIGS. 15 to 17

FIG. 15 is a cross section of another example of the ferromagnetic tunnel junction 21 in the MR element according to the present invention, FIG. 16 is a cross section along line 17—17 in FIG. 15, FIG. 17 is a cross section along line 16—16 in FIG. 16 and FIG. 18 illustrates the operation of the tunnel junction portion in the MR element shown in FIGS. 15 to 17. In the figures, the same reference numbers are assigned to components identical to those shown in FIGS. 6 to 8 and their detailed explanation is omitted.

In this embodiment, the second ferromagnetic film 212 constitutes a free ferromagnetic film and the first ferromagnetic film 211 constitutes a pinned ferromagnetic film. Magnetic domain control films 214 and 215 constituting the magnetic domain control film are formed at the two end portions of the second ferromagnetic film 212. These films are formed in such a manner that the magnetic easy axis of the first ferromagnetic film 211 extends parallel to the externally applied magnetic field H and the magnetic easy axis of the second ferromagnetic film 212 extends perpendicular to the externally applied magnetic field H. In this case, the direction of magnetization M1 of the first ferromagnetic film 211 is pinned relative to the external magnetic field H whereas the direction of magnetization M2 of the second ferromagnetic film 212 can change freely relative to the external magnetic field H. This structure, too, achieves advantages similar to those achieved in the embodiment illustrated in FIGS. 1 to 3.

Figure 19:
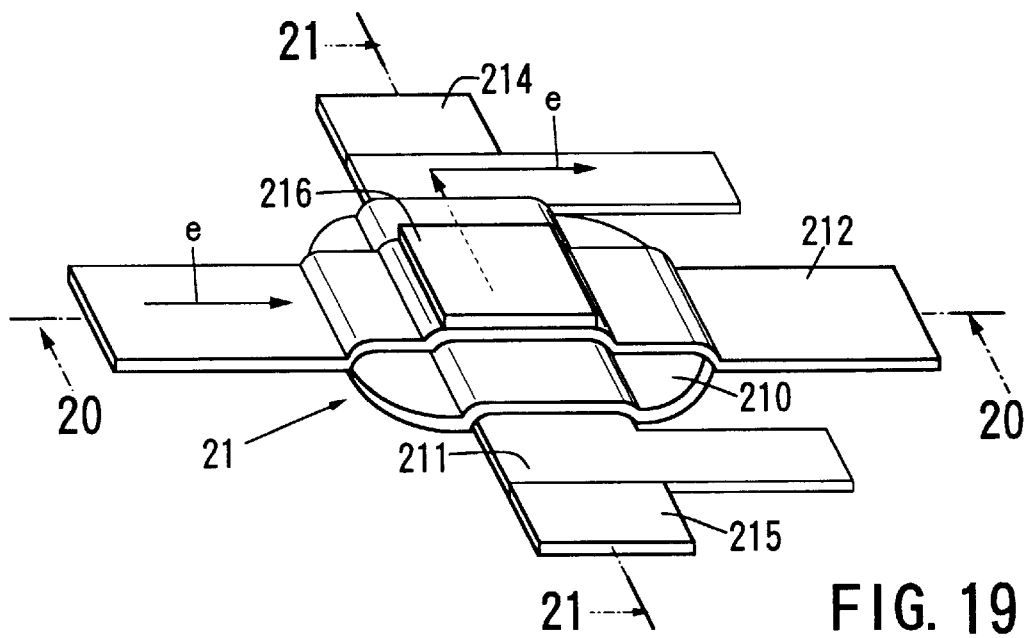
FIG. 19 is a cross section showing another example of the ferromagnetic tunnel junction in the magnetic head according to the present invention.
Figure 20:
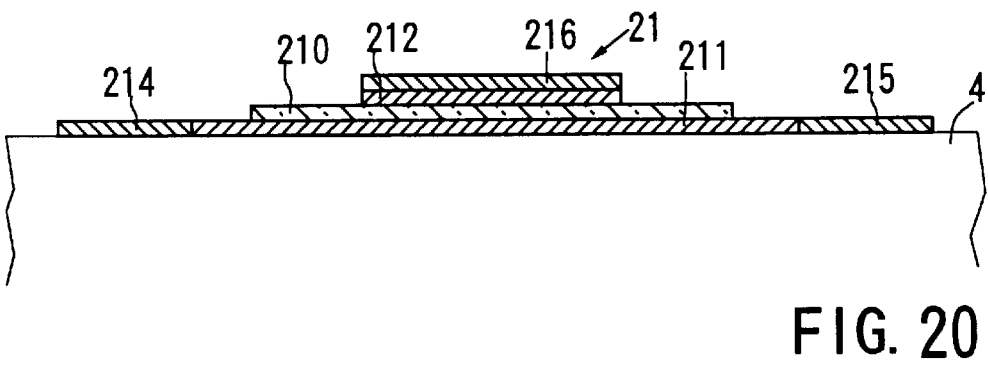
FIG. 20 is a cross section along line 21—21 in FIG. 19.
Figure 21:
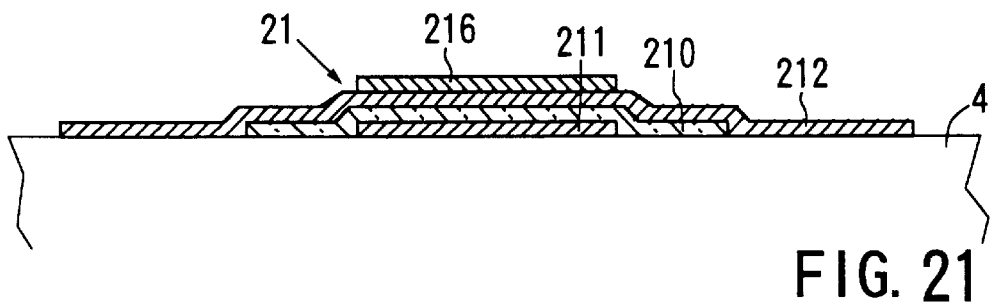
FIG. 21 is a cross section along line 20—20 in FIG. 19.

FIG. 19 is a cross section of another example of the ferromagnetic tunnel junction 21, FIG. 20 is a cross section along line 21—21 in FIG. 19 and FIG. 21 is a cross section along line 20—20 in FIG. 19. In this embodiment, the magnetization pinning film 216 is provided on the surface of the second ferromagnetic film 212. Consequently, the second ferromagnetic film 212 functions as a pinned ferromagnetic film with the first ferromagnetic film 211 constituting a free ferromagnetic film. Although not shown, the magnetization pinning film 216 may be provided at the first ferromagnetic film 211. In that case, the first ferromagnetic film 211 functions as a pinned ferromagnetic film with the second ferromagnetic film 212 constituting a free ferromagnetic film.

Figure 22:
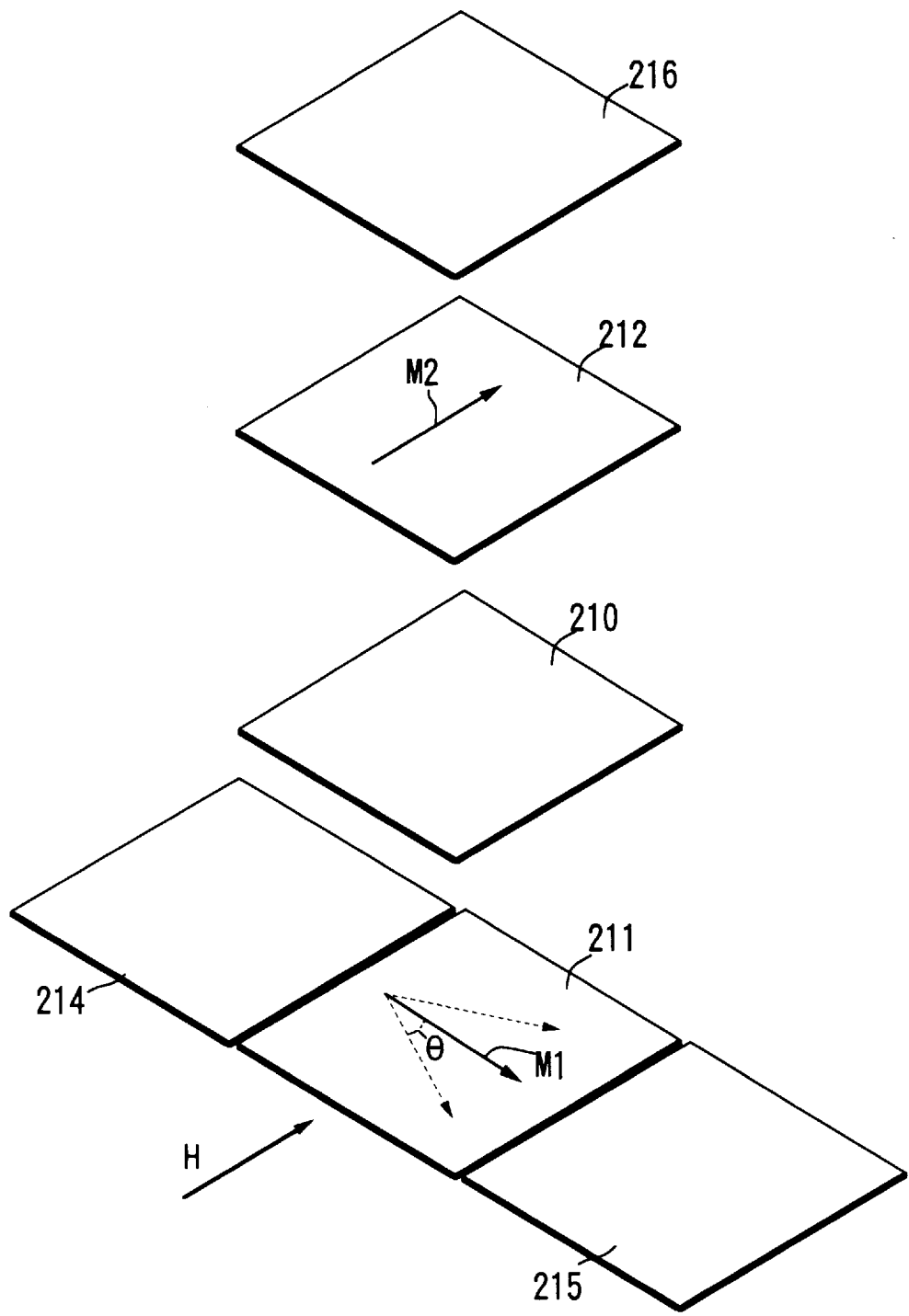
FIG. 22 is a diagram illustrating the operation of the tunnel junction portion in the MR element shown in FIGS. 19 to 21.

FIG. 22 illustrates the operation of the tunnel junction portion of the MR element shown in FIGS. 19 to 21 In this embodiment, when the applied magnetic field is at zero, the direction of magnetization M1 of the first ferromagnetic film 211 extends perpendicular to the applied magnetic field and the direction of magnetization M2 of the second ferromagnetic film 212 is pinned in the direction that extends parallel to the magnetic field H to be applied. When the magnetic field H is applied by a magnetic recording medium such as a magnetic disk, the direction of magnetization M1 of the first ferromagnetic film 211 changes by, for instance, an angle θ, while the direction of magnetization M2 of the second ferromagnetic film 212 which is pinned by the magnetization pinning film 216 remains unchanged. Thus, a magnetoresistance effect is generated.

With this, simply by changing the magnetization direction of the first ferromagnetic film 211, which is the free ferromagnetic film, a relative angle change is achieved in regard to the directions of magnetization of the two ferromagnetic films 211 and 212. In this case, the magnetic easy axis of the first ferromagnetic film 211 constituting the free ferromagnetic film whose direction of magnetization M1 changes freely should be set perpendicular to the external magnetic field H, and the magnetic easy axis of the second ferromagnetic film 212 constituting the pinned ferromagnetic film whose direction of magnetization M2 is pinned should be set parallel to the external magnetic field H. This ensures that since the direction of magnetization of the first ferromagnetic film 211 constituting the free ferromagnetic film is caused to change by the external magnetic field in the magnetization rotation mode, a high MR sensitivity is achieved, and that smooth magnetization reversal can be implemented, making it possible to reduce the generation of Barkhausen noise resulting from the magnetic domain wall motion.

(Insulating film)

The insulating film 210 provided between the first ferromagnetic film 211 and the second ferromagnetic film 212 plays an extremely important role in achieving a high MR ratio while also achieving good reproduction characteristics and in simplifying the structure of the MR element in a magnetic head or the like. In particular, when the barrier potential of the insulating film 210 is set within a range of 0.5 to 3 eV, a high MR ratio can be achieved while also realizing good reproduction characteristics and achieving a simplification in the MR element structure, as has been explained above.

(Combination of magnetization pinning and magnetic domain control)

In the embodiment illustrated in FIGS. 19 to 22, the magnetization pinning film 216 is provided on the second ferromagnetic film 212 and the magnetic domain control films 214 and 215 are provided at the two ends of the first ferromagnetic film 211. As a result, the advantages of both the magnetic domain control and magnetization pinning are achieved.

Next, examples of a magnetic head which employs the ferromagnetic tunnel junction according to the present invention are explained.

Figure 23:
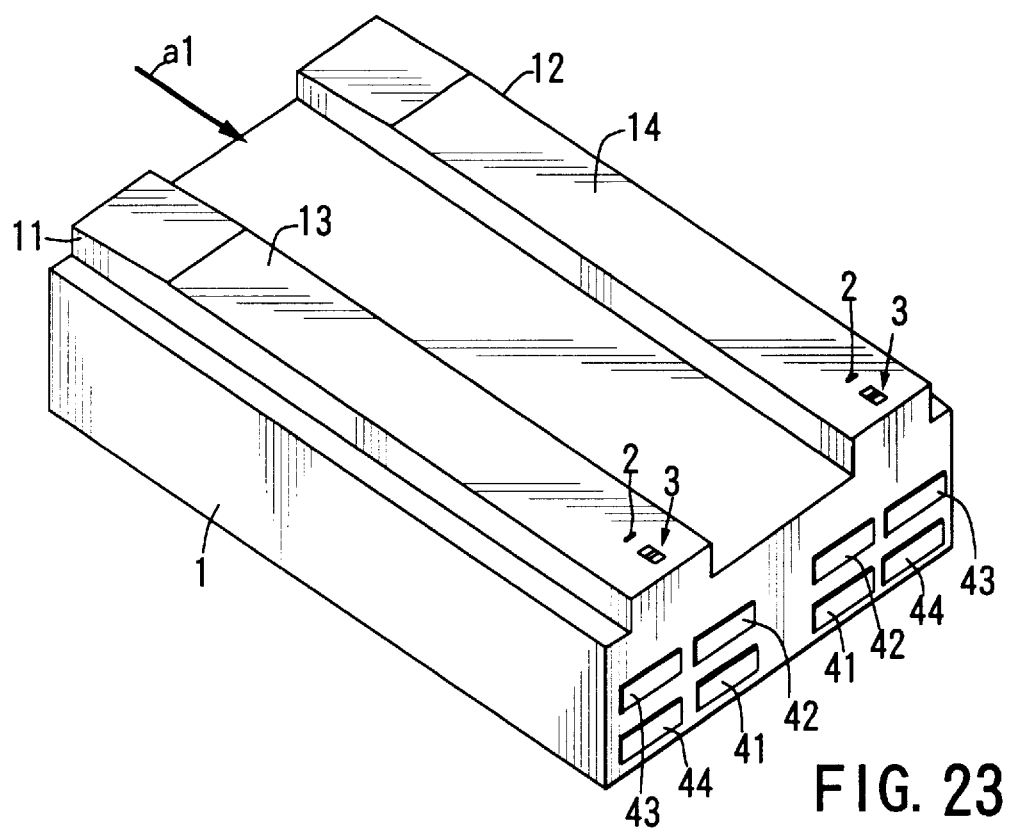
FIG. 23 is a perspective of the magnetic head according to the present invention.

FIG. 23 is a perspective of the magnetic head according to the present invention. In the figure, the dimensions are exaggerated. The magnetic head according to the present invention in the figure includes a slider 1, a magnetic conversion element (hereafter referred to as a ferromagnetic tunnel junction type magnetic conversion element) 2 which utilizes a ferromagnetic tunnel junction and an inductive magnetic conversion element 3. The slider 1 is provided with rail portions 11 and 12 at the surface facing opposite the medium and the surfaces of the rail portions 11 and 12 constitute air bearing surfaces 13 and 14. The number of rail portions 11 and 12 is not limited to two. One to three rail portions may be provided or the slider may have a flat surface with no rail portions. In addition, various geometric forms may be adopted at the air bearing surface (hereafter referred to as the ABS) in order to improve the flying characteristics and the like. The present invention may be adopted in any of those types of sliders.

The magnetic conversion elements 2 and 3 are provided toward the end portion of the direction of medium movement al at either one or both of the rail portions 11 and 12. The direction of medium movement al matches the direction in which the air that is forced around when the medium notes at high speed, flows out. At the end surface of the slider 1 in the direction of medium movement al, bumps 41 and 42 connected to the ferromagnetic tunnel junction type magnetic conversion element 2 and bumps 43 and 44 connected to the magnetic conversion element 3 are provided.

Figure 24:
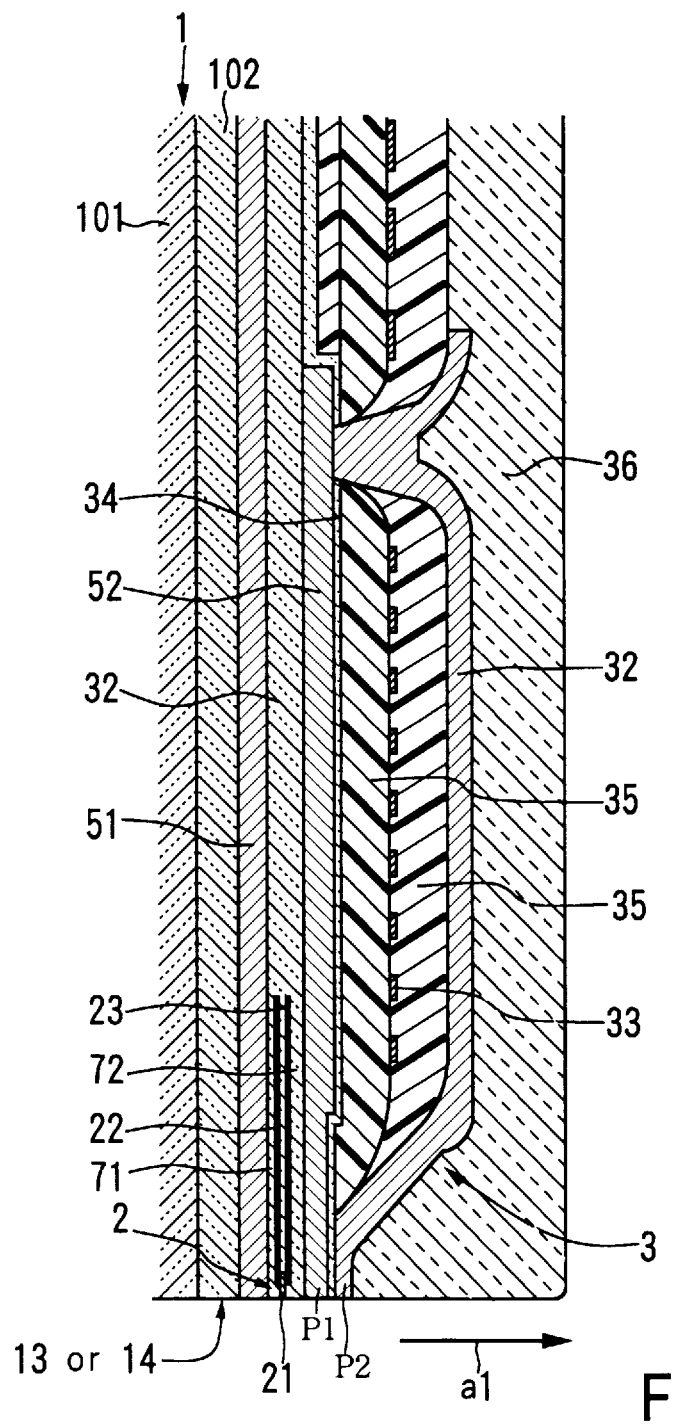
FIG. 24 is an enlarged cross section of the magnetic conversion element portion of the magnetic head shown in FIG. 23.

FIG. 24 is an enlarged cross section of the magnetic conversion element portion of the magnetic head shown in FIG. 23. The ferromagnetic tunnel junction type magnetic conversion element 2 constitutes a reproduction element, whereas the inductive magnetic conversion element 3 constitute a write element. The ferromagnetic tunnel junction type magnetic conversion element 2 and the inductive magnetic conversion element 3 are laminated on an insulating film 102, which is provided on a ceramic base body 101 constituting the slider 1. The ceramic base 101 is normally constituted of $Al_2O_3$-TiC. Since $Al_2O_3$-TiC is conductive, the insulating film 102, which may be constituted of $Al_2O_3$, for instance, is formed on top as a means for achieving electrical insulation. If the ceramic base 101 provides a high degree of insulation, the insulating film 102 may be omitted.

Figure 25:
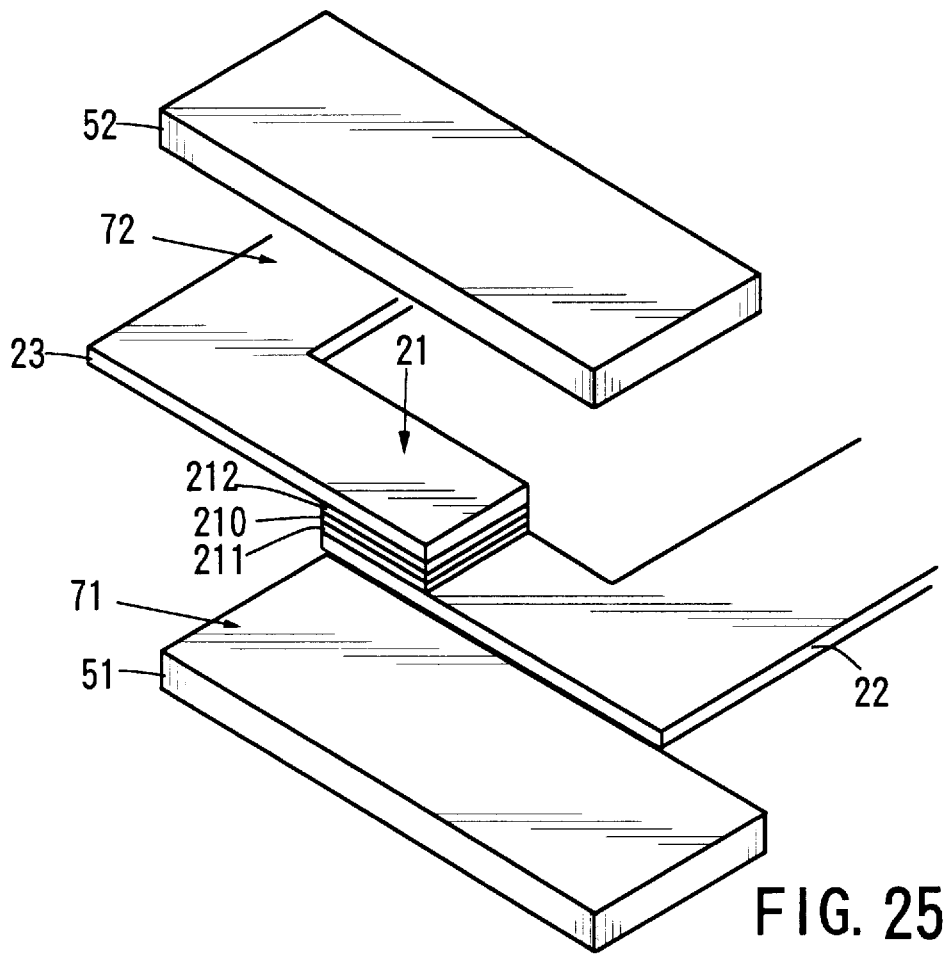
FIG. 25 is a perspective schematically showing the structure of a magnetic head employing the ferromagnetic tunnel junction according to the present invention.

FIG. 25 is a perspective schematically showing the structure of the ferromagnetic tunnel junction type magnetic conversion element 2 employed in the magnetic head shown in FIGS. 23 and 24. A bottom shield film 51 and a upper shield film 52 are provided above both sides of the ferromagnetic tunnel junction 21 respectively.

In FIG. 24, a combined type magnetic head provided with the inductive magnetic conversion element 3, which constitutes a write element along with the ferromagnetic tunnel junction type magnetic conversion element 2 which constitutes a reproduction element is illustrated in the figures. The inductive magnetic conversion element 3 is provided with a lower magnetic film 52 that also functions as an upper magnetic shield film for the ferromagnetic tunnel junction type magnetic conversion element 2, an upper magnetic film 32, a coil film 33, a gap film 34 constituted of alumina or the like, an insulating film 21 constituted of an organic resin such as Novolak® and a protective film 36 constituted of alumina or the like. The front end portions of the lower magnetic film 52 and the upper magnetic film 32 constitute a lower pole tip P1 and an upper pole tip P2 that face opposite each other across the gap film 34 with a very small thickness, and write operations are performed at the lower pole tip P1 and the upper pole tip P2. The yoked portions of the lower magnetic film 52 and the upper magnetic film 32 are linked to each other so that they complete a magnetic circuit at the back gap portion, which is on the opposite side from the lower pole tip p1 and the upper pole tip P2. The coil film 33 is formed in such a manner that it winds around the linking area of the yoked portions in a coil, in the insulating film 21. The two ends of the coil film 33 are electrically continuous to the bumps 43 and 44. The number of coils and the number of layers of the coil film 33 are arbitrary.

Next, a method for manufacturing the magnetic head illustrated in FIGS. 23 to 25 is explained bellow.

First, a Sendust film with a film thickness of 2 μm was formed by DC sputtering to constitute a bottom shield film 51 on an $Al_2O_3$ to TiC substrate (not shown) upon which an alumina insulating film with a film thickness of 30 μm was formed. A specific shape was achieved by using photolithography and Ar ion etching.

Next, an alumina film with a film thickness of 80 nm was formed through RF sputtering to constitute a lower insulating film 71. Then, a Ta (10 nm)/Cu(100 nm)/Ta (10 nm) film was formed through DC sputtering to constitute a first electrode film 22 after resist patterning. It was then processed to achieve a specific shape by employing the lift-off method.

Then, the first ferromagnetic film 211 constituted of a $Co_{50}Fe_{50}$ film with a film thickness of 10 nm, the insulating film 210 constituted of a DLC film with a film thickness of 5nm and the second ferromagnetic film 212 constituted of a Co film with a film thickness of 5nm were laminated, thereby forming the ferromagnetic tunnel junction 21. The method of actually forming the ferromagnetic tunnel junction is explained below.

First, a $Co_{50}Fe_{50}$ (10 nm) layer was formed by RF sputtering to constitute the first ferromagnetic film 211 after resist patterning, and then a DLC (5 nm) layer was formed by the plasma CVD method to constitute the insulating film 210. Next, a Co (10 nm) layer was formed by RF sputtering to constitute the second ferromagnetic film 212 and a shape with a width of 1 μm by a length of 6 μm was achieved through the lift-off method.

Finally, a Ta (10 nm)/Cu(100 nm)/Ta(10 nm) film was formed to constitute a second electrode film 23 after resist patterning, in the same method as that employed for forming the first electrode film 22. It was then machined to achieve a specific shape through the lift-off method. It is to be noted that before forming the second electrode film, a surface oxide layer and the like formed on top of the second ferromagnetic film 212 was removed by sputter etching to ensure that the final thickness of the second ferromagnetic film would be 5 nm. An alumina film with a film thickness of 90 nm was formed on top to constitute an upper insulating film 72.

Next, a NiFe film with a film thickness of 2 μm was formed by DC sputtering to constitute an upper shield film 52, which was then formed to a specific shape by photolithography and Ar ion etching. Finally, an Cu bump electrode film was prepared by plating and deposited with alumina film with a film thickness of 30 μm to constitute a protective film. After that, it was polished to achieve a specific size to produce an MR head for reproduction with a junction area 1 μm wide by 1 μm long. In other words, the track width and the MR height of the head were both 1 μm, and the distance between the MR shields was 0.27 μm.

(AMR Head in the prior art : Example for Comparison)

Figure 26:
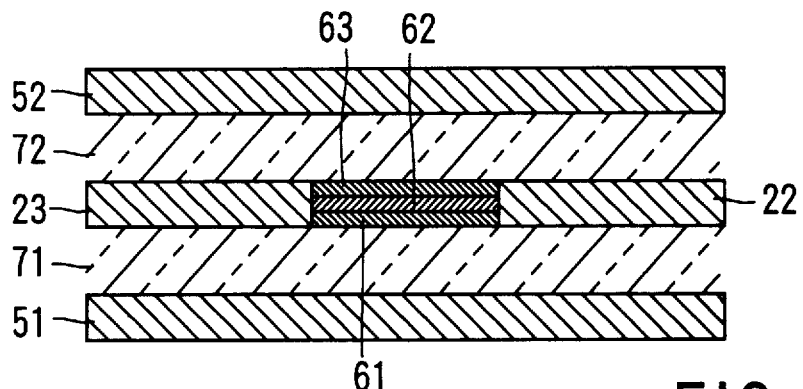
FIG. 26 is a cross section illustrating the structure of a magnetic head in the prior art which utilizes the AMR effect.

For purposes of comparison, an AMR head in the prior art which employs an NiFe layer employing the SAL bias method to constitute an AMR film with a track width at 1 μm, the MR height at 1 μm and the distance between the MR shields at 0.27 μm as shown in FIG. 26 was also prepared. The method for fabricating this AMR head is explained below. It was fabricated in a manner identical to that for fabricating the ferromagnetic tunnel junction type MR head according to the present invention up to the formation of the lower insulating film 71. After forming the lower insulating film 71, an NiFeRh film 61, a Ta film 62 and a NiFe film 63 were formed by DC sputtering to constitute an SAL film, a magnetic separation film and an MR film respectively, then the entire element was processed to achieve a rectangular shape through fine machining technology. After this, the electrode films 22 and 23, the upper insulating film 72 and the upper shield film 52 were formed through thin film technology and fine machining technology.

Figure 27:
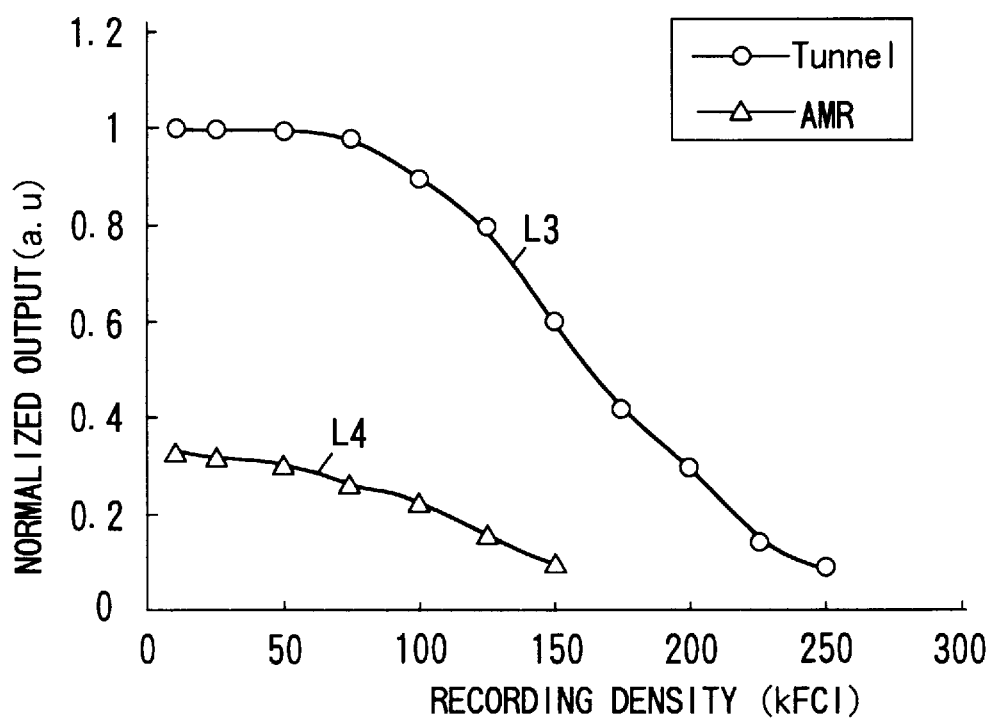
FIG. 27 shows the reproduction characteristics of the reproduction magnetic head according to the present invention and the AMR head in the prior art.

Using these magnetic heads, a recorded signal written in a magnetic recording medium with a coercivity of 25000e and a film thickness of 50nm was reproduced to examine the characteristics of these magnetic heads. FIG. 27 illustrates a comparison of reproduction output and recording density per unit track width. The curve L3 represents the characteristics of the magnetic head employing the ferromagnetic tunnel junction according to the present invention, whereas the curve L4 illustrates the characteristics of the AMR head in the prior art. As shown in FIG. 27, with the MR head for reproduction according to the present invention, a reproduction output 4 to 5 times that of the AMR head in the prior art was achieved.

Figure 28:
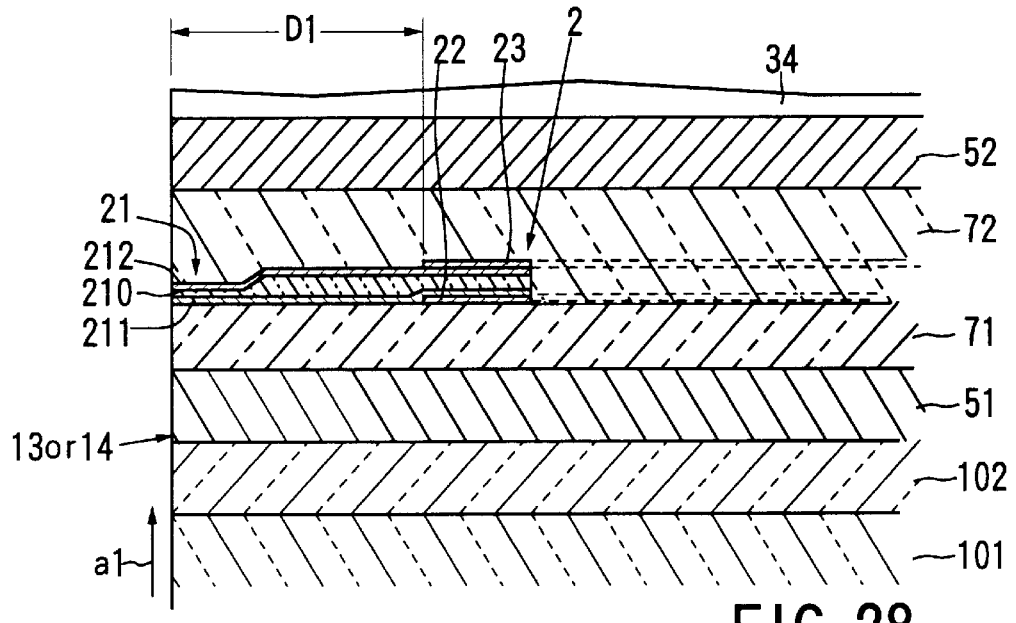
FIG. 28 is an enlarged cross section of the MR element portion.
Figure 29:
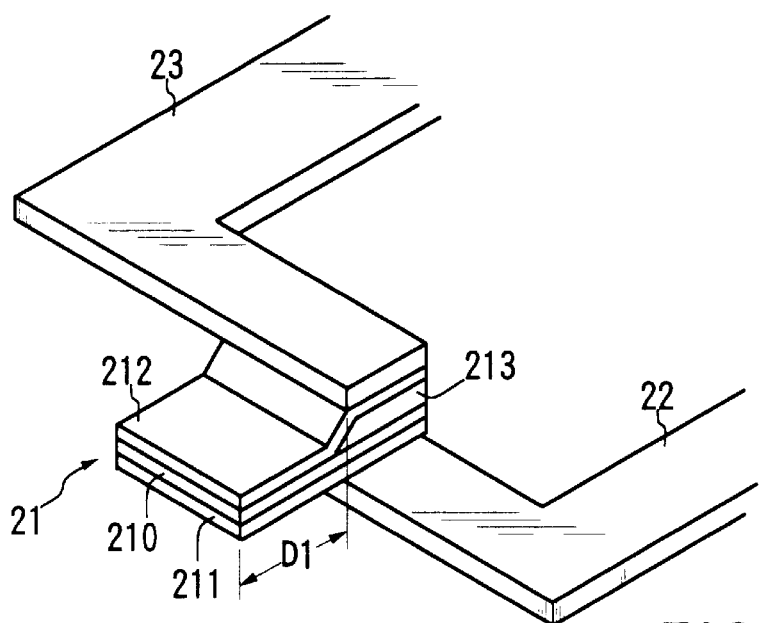
FIG. 29 is an enlarged perspective of the MR element.
Figure 30:
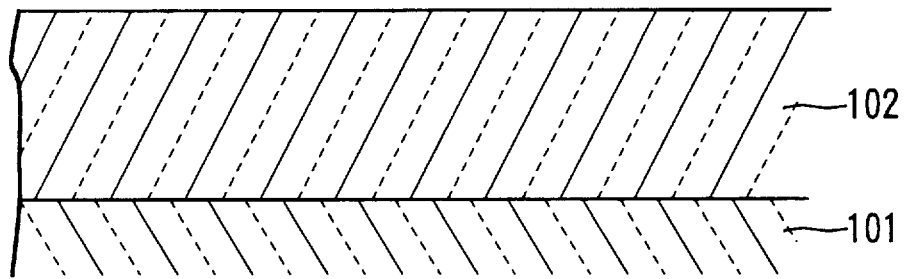
FIG. 30 is a diagram illustrating the method for manufacturing the magnetic head according to the present invention.

FIG. 28 is an enlarged cross section of the ferromagnetic tunnel junction type magnetic conversion element 2 and FIG. 29 is its enlarged perspective.

As these figures show, the ferromagnetic tunnel junction type magnetic conversion element 2 includes a ferromagnetic tunnel junction 21 and electrode films 22 and 23 and is supported by insulating films 71 and 72, which constitute part of the slider 1. The ferromagnetic tunnel junction 21 includes an insulating film 210, a first ferromagnetic film 211 and a second ferromagnetic film 212. The first ferromagnetic film 211 and the second ferromagnetic film 212 are laminated via the insulating film 210.

The electrode films are constituted of a first electrode film 22 and a second electrode film 23. The first electrode film 22 is connected to the first ferromagnetic film 211, whereas the second electrode film 23 is connected to the second ferromagnetic film 212.

These electrode films, i.e., the first electrode film 22 and the second electrode film 23 are provided in such a manner that they are not exposed at the ABS 13 (or 14). As a specific means for ensuring this, in the embodiment, the front end surface of the ferromagnetic tunnel junction 21 is positioned at the ABS 13 (or 14) and, in addition, the first electrode film 22 and the second electrode film 23 are far from the ABS 13 (or 14) where the front end surface of the ferromagnetic tunnel junction 21 is positioned, by a distance D1.

The ferromagnetic tunnel junction type magnetic conversion element 2 is positioned inside the insulating films 71 and 72 between a lower magnetic shield film 51 and an upper magnetic shield film 52. The lower magnetic shield film 51 is provided on the insulating film 102, which is provided at the ceramic base body 101, and the insulating film 71 is formed on the bottom magnetic shield film 51.

It has been learned that by achieving a structure in which the first electrode film 22 and the second electrode film 23 are not exposed at the ABS 13 (or 14) as described above, electrostatic breakdown becomes less likely to occur at the bottom magnetic shield film 51, the upper magnetic shield film 52 and the ferromagnetic tunnel junction type magnetic conversion element 2, and in particular, between the first electrode film 22 and the second electrode film 23, achieving an improvement in the voltage resistance.

Furthermore, since the distance between the bottom magnetic shield film 51 and the ferromagnetic tunnel junction 21, which constitutes the sensing portion, and the distance between the upper magnetic shield film 52 and the ferromagnetic tunnel junction 21 can be reduced at the ABS 13 (or 14), higher density recording/reproduction compared to the prior art becomes possible.

Next, in reference to FIGS. 30 to 42, a method for manufacturing the magnetic head according to the present invention is explained.

First, Sendust was deposited by the DC sputtering method onto an AlTiC base 101 (see FIG. 30) upon which an alumina insulating film 102 with a film thickness of 30 µm had been formed, to constitute the bottom magnetic shield film 51 with a film thickness of 2 µm (see FIG. 31). Next, after performing heat treatment in a magnetic field for two hours at approximately 450° C. within a vacuum, a specific shape was achieved through photolithography and Ar ion etching.

Then, an alumina film with a film thickness of 100 nm was formed to constitute the insulating film 71 by the RF sputtering method (see FIG. 32). After this, a Ta (10 nm)/Cu (100 nm)/Ta (10 nm) film was formed by the DC sputtering method to constitute the first electrode film 22 (see FIG. 33). Then, resist patterning was performed, and the first electrode film 22 was achieved by forming a specific shape through Ar ion etching (see FIG. 34).

Next, as a means for forming the ferromagnetic tunnel junction 21, Co-50 at % Fe (10 nm)/aluminum oxide (5 nm)/Fe (5 nm) and its surface antioxidant film Ta (5 nm) were prepared as described below. First, the Co-50 at % Fe (10 nm)/Al (5 nm) were continuously formed through the DC sputtering method onto the first electrode film 22. After this, the sample was taken out and left in the air for 24 hours at approximately 60° C. for annealing so that the Al (5 nm) became thermally oxidized. Thus, the first ferromagnetic film 211 and the Co/50 at % Fe (10 nm)/aluminum oxide (5 nm) film which would constitute an intermediate insulating film 210 were formed (see FIG. 35).

After this, in order to form a short circuit preventing insulating film 213, the area other than the tunnel junction portion to be formed was covered with resist and an alumina insulating film (film thickness 50 nm) was formed by the RF sputtering method. Then, the resist was lifted off to form the short circuit preventing insulating film 213 (see FIG. 36). The insulating film 213 is formed to ensure that no tunnel current runs in areas other than the ferromagnetic tunnel junction 21.

Next, the sample was set within the DC sputtering apparatus again, and the second ferromagnetic film 212 was formed by continuously forming an Fe (5 nm) film, and a Ta (5 nm) film (see FIGS. 37 and 38). It is to be noted that the Ta (5 nm) film constitutes a protective film which prevents the surface from becoming oxidized during the process.

Then, resist patterning was performed and after Ar ion etching was performed, the resist was taken off to form the ferromagnetic tunnel junction 21. Next, resist patterning was performed again, and following that, a Ta (10 nm)/Cu (100 nm)/Ta (10 nm) film was formed. Then, the lift-off method was used to form the second electrode film 23. (See FIG. 39).

Next, an alumina film with a film thickness of 120 nm was formed by the RF sputtering method to constitute the upper insulating film 72 (see FIG. 40). Then, an NiFe (film thickness 2 µm) was formed by the DC sputtering method to constitute the upper magnetic shield film 52, and following this, patterning was performed to achieve a specific shape by photolithography and etching technologies (see FIG. 41).

After this, the processes that are required to achieve the magnetic head shown in FIGS. 1 and 2 were executed, and in addition, by performing wafer cutting and machining/polishing along line X1-X1 in FIG. 42, the ferromagnetic tunnel junction 21 was exposed at the ABS. In this manner, a magnetic head provided with a ferromagnetic tunnel junction 21 with a junction area of 1 µm×2 µm (junction height 1 µm, junction width 2 µm) was obtained.

For purposes of comparison, a ferromagnetic tunnel junction type magnetic head with its electrode films 22 and 23 exposed at the ABS was also prepared.

(Evaluation of characteristics)

Electrostatic breakdown tests were performed with the magnetic heads prepared as described above mounted to a magnetic head gimbal. For the electrostatic breakdown tests, a metal plate with a polished surface was prepared. A power source was connected to the metal plate and a magnetic head was placed on the plate. With the magnetic head connected to the ground, the relationship between the resistance between the magnetic head and the metal plate and the voltage applied to the metal plate was examined.

The results of the tests indicate that with the magnetic head in the prior art with its electrode films 22 and 23 exposed at the ABS, the resistance increases radically when the applied voltage is at 50 V, causing an electrostatic breakdown. In contrast, with the magnetic head according to the present invention, electrostatic breakdown did not occur until the applied voltage reached approximately 150 V, demonstrating a voltage withstand that is approximately 3 times that in the magnetic head in the prior art.

The insulating film 210 provided between the first ferromagnetic film 211 and the second ferromagnetic film 212 plays an extremely important role in achieving a high MR ratio while also achieving good reproduction characteristics and in simplifying the magnetic head structure. In particular, when the barrier potential of the insulating film 210 is set within a range of 0.5–3 eV, a high MR ratio can be achieved while also realizing good reproduction characteristics and achieving a simplification in the magnetic head structure. This point is explained below.

Now, the stable antiferromagnetically coupling formed between the first ferromagnetic film 211 and the second ferromagnetic film 212 via the insulating film 210 within the barrier potential range of 0.5 to 3 eV in this ferromagnetic tunnel junction offers a great advantage when it is adopted as a read magnetic conversion element in a magnetic head.

As shown in FIG. 3, when antiferromagnetically coupling is generated, the magnetic field-magnetoresistance curves L1 and L2 achieve the highest values for MR ratio in the area H in the vicinity of zero magnetic field. Consequently, when this ferromagnetic tunnel junction is employed for a magnetic conversion read element in a magnetic head, a linear region is obtained in the vicinity of the zero magnetic field simply as a shape effect without having to apply a bias magnetic field. Thus, the structure of the magnetic head can be simplified (See FIGS. 28 and 29).

According to the present invention, the coercivity of the first ferromagnetic film 211 and the coercivity of the second ferromagnetic film 212 are made to differ from each other. When the coercivity H1 of the first ferromagnetic film 211 and the coercivity H2 of the second ferromagnetic film 212 are made to differ from each other to satisfy H1>H2 (or H2>H1), as shown in the FIG. 4, the magnetization curve forms a two-step loop.

The direction of magnetization of the first ferromagnetic film 211 and the direction of magnetization of the second ferromagnetic film 212 are antiparallel to each other when the applied magnetic field is larger than the coercivity H2 (absolute value) and, at the same time, smaller than the coercivity H1 (absolute value), whereas they are parallel to each other when the applied magnetic field is larger than the coercivity HI. The electrical resistance increases when the directions of magnetization are in an antiparallel state and is reduced when the directions of magnetization are in a parallel state. With the resistance value achieved when the directions of magnetization are parallel to each other assigned Rs and the quantity of change in the resistance when the directions of magnetization shift from an antiparallel state to a parallel state assigned ΔR, the MR ratio is ΔR/Rs. With this, it becomes possible to detect an externally applied magnetic field.

In another example, the direction of the magnetization of the second ferromagnetic film 212 is pinned. With this, simply by changing the direction of the magnetization of the first ferromagnetic film 211 alone, the direction of the first ferromagnetic film 211 relative to that of the second ferromagnetic film 212 can be made parallel or antiparallel.

Next, a magnetic head according to the present invention and an AMR head in the prior art are evaluated.

(Magnetic head according to the present invention)

A magnetic head which employs the $Co_{50}Fe_{50}$/DLC/Co ferromagnetic tunnel junction in the Embodiment 2 was produced, the recorded signal written in a magnetic recording medium was read out and its reproduction sensitivity and reproduction output were examined to be compared with those of the AMR magnetic head in the prior art. The ferromagnetic tunnel junction 21 in the magnetic head according to the present invention was 1 μm in width and 1 μm in length. In other words, the track width of the magnetic head was set at 1 μm and its MR height was set at 1 μm. The MR shield gap distance was set at 0.27 μm.

(AMR magnetic head in the prior art: Example for Comparison)

For purposes of comparison, an AMR magnetic head in the prior art which employs an NiFe film in the SAL bias method to constitute its MR film, with its track width set at 1 μm, MR height set at 1 μm and MR shield gap distance set at 0.27 μm was also fabricated. The fabricating method is explained below. It was manufactured in the same manner as that employed for producing the ferromagnetic tunnel junction type MR magnetic head according to the present invention up to the formation of its lower insulating film. After the lower insulating film was formed, an NiFeRh film, a Ta film and an NiFe film were first formed by the DC sputtering method to constitute the SAL film, the magnetic separation film and the MR film respectively, and then were patterned to achieve a rectangular shape by fine machining technology. After this, the electrode films, the upper insulating film an the upper shield film were formed through thin film technology and fine machining technology.

Using these magnetic heads, a recorded signal written in a magnetic recording medium with a coercivity of 25000 e and a film thickness of 50 nm was reproduced to examine the characteristics of these magnetic heads.

The magnetic head employing the ferromagnetic tunnel junction according to the present invention showed the same characteristics as the curve L3 illustrated in FIG. 27, whereas the AMR head in the prior art showed the same characteristics as the curve L4 illustrated in FIG. 27, and with the ferromagnetic tunnel junction type magnetic head according to the present invention, a reproduction output 4 to 5 times that of the AMR magnetic head in the prior art was achieved.

In addition, in the ferromagnetic tunnel junction type magnetic head according to the present invention, the ferromagnetic tunnel junction 21 may be provided with means for magnetic control at the first ferromagnetic film 211 or the second ferromagnetic film 212. One such means is achieved by pinning the direction of magnetization of either the first ferromagnetic film 211 or the second ferromagnetic film 212, and another means is achieved by implementing magnetic domain control to the ferromagnetic film which is either first ferromagnetic film 211 or the second ferromagnetic film 212 whose magnetization is not pinned. These means are normally employed in combination, but they may also be used independently.

FIG. 43 is an enlarged cross section of the ferromagnetic tunnel junction type magnetic conversion element 2, FIG. 44 is a cross section along line 44—44 in FIG. 43. The ferromagnetic tunnel junction type magnetic conversion element 2, employs a structure for the ferromagnetic tunnel junction 21 which is essentially the same as that employed in the MR element shown in FIGS. 6 to 8. In other words, the ferromagnetic tunnel junction type magnetic conversion element 2 includes a ferromagnetic tunnel junction 21 and electrode films 22 and 23 and is supported by insulating films 71 and 72, which constitute part of the slider 1. The ferromagnetic tunnel junction 21 includes an insulating film 210, a first ferromagnetic film 211 and a second ferromagnetic film 212. The first ferromagnetic film 211 and the second ferromagnetic film 212 are laminated via the insulating film 210. Magnetic domain control films 214 and 215 are provided adjacent to the two end portions of the first ferromagnetic film 211.

The electrode films are constituted of a first electrode film 22 and a second electrode film 23. The first electrode film 22 is connected to the first ferromagnetic film 211, whereas the second electrode film 23 is connected to the second ferromagnetic film 212.

These electrode films, i.e., the first electrode film 22 and the second electrode film 23 are provided in such a manner that they are not exposed at the ABS 13 (or 14). As a specific means for ensuring this, in the embodiment, the front end surface of the ferromagnetic tunnel junction 21 is positioned at the ABS 13 (or 14) and, in addition, the first electrode film 22 and the second electrode film 23 are far from the ABS 13 (or 14) where the front end surface of the ferromagnetic tunnel junction 21 is positioned, by a distance D1 (see FIG. 46).

The ferromagnetic tunnel junction type magnetic conversion element 2 is positioned inside the insulating films 71 and 72 between a bottom magnetic shield film 51 and an upper magnetic shield film 52. The bottom magnetic shield film 51 is provided on the insulating film 102, which is provided at the ceramic base body 101, and the insulating film 71 is formed on the bottom magnetic shield film 51.

FIG. 45 shows another embodiment of the ferromagnetic tunnel junction type magnetic conversion element . In this embodiment, the ferromagnetic tunnel junction type magnetic conversion element 2 employs a structure for the ferromagnetic tunnel junction 21 that is essentially the same as that employed in the MR element shown in FIGS. 15 to 17. In other words, the ferromagnetic tunnel junction 21 includes an insulating film 210, a first ferromagnetic film 211 and a second ferromagnetic film 212. The first ferromagnetic film 211 and the second ferromagnetic film 212 are laminated via the insulating film 210. Magnetic domain control films 214 and 215 are provided adjacent to the two end portions of the second ferromagnetic film 212.

FIG. 46 is an enlarged cross section of the ferromagnetic tunnel junction type magnetic conversion element 2 provided with the magnetization pinning film 216 and FIG. 47 is an enlarged perspective of the same element. In the figures, the same reference numbers are assigned to components that are identical to those in FIGS. 28 to 30 and their explanation is omitted. In this embodiment, the ferromagnetic tunnel junction type magnetic conversion element 2 employs a structure for its ferromagnetic tunnel junction 21 that is essentially identical to that of the MR element shown in FIGS. 19 to 21. In other words, the ferromagnetic tunnel junction type magnetic conversion element 2 includes a ferromagnetic tunnel junction 21 and electrode films 22 and 23, and is supported by insulating films 71 and 72 which constitute part of the slider 1. The ferromagnetic tunnel junction 21 includes an insulating film 210, a first ferromagnetic film 211 and a second ferromagnetic film 212. The first ferromagnetic film 211 and the second ferromagnetic film 212 are laminated via the insulating film 210. Magnetic domain control films 214 and 215 are provided adjacent to the two end portions of the first ferromagnetic film 211. A magnetization pinning film 216 is provided on top of the second ferromagnetic film 212.

The electrode films are constituted of a first electrode film 22 and a second electrode film 23. The first electrode film 22 is connected with the first ferromagnetic film 211, whereas the second electrode film 23 is connected with the second ferromagnetic film 212 via the magnetization pinning film 216. Next, an example in which the ferromagnetic tunnel junction according to the present invention is adopted in a magnetoresistive film in a magnetic head is explained.
(Embodiment 3)

An MR head for reproduction that employs the $Ni_{80}Fe_{20}$/thermally oxidized aluminum film/Co ferromagnetic tunnel junction in Embodiment 1 to constitute its magnetoresistive film provided with a magnetic domain control film and a magnetic head not provided with the magnetic domain control film were fabricated, and recorded signals written in magnetic recording media were read out to compare their reproduction characteristics. In this embodiment, the first ferromagnetic film 211 was constituted of $Ni_{80}Fe_{20}$ film, the intermediate insulating film 210 was constituted of a thermally oxidized aluminum film and the second ferromagnetic film 212 was constituted of a Co film with the individual film thicknesses set at 20 nm, 5 nm and 5 nm for the $Ni_{80}Fe_{20}$ film, the thermally oxidized aluminum film and the Co film respectively. Next, the method employed for producing the magnetic heads is explained.

First, a Sendust film with a film thickness of 2 μm was formed by DC sputtering to constitute the bottom magnetic shield film 51 on an $Al_2O_3$-TiC base 101 (not shown) where an alumina insulating film 102 with a film thickness of 30 μm had been formed, and a specific shape was patterned by photolithography and Ar ion etching after subjecting it to heat treatment in a magnetic field.

Next, an alumina film with a film thickness of 80 nm was formed on top of this to constitute the lower insulating film 71 by RF sputtering, and then, after resist was patterned, a Ta (10 nm)/Cu (100 nm)/Ta(10 nm) film was formed by DC sputtering to constitute the first electrode film 22. After that, a specific shape was obtained by the lift-off method.

Then, a ferromagnetic tunnel junction 21 constituted by laminating the first ferromagnetic film 211 constituted of an $Ni_{80}Fe_{20}$ film with a film thickness of 20 nm, the intermediate insulating film 210 constituted of a thermally oxidized aluminum film with a film thickness of 5 nm and the second ferromagnetic film 212 constituted of a Co film with a film thickness of 5 nm was formed. In order to form the ferromagnetic tunnel junction, a sputtering/electron beam deposition combined film formation apparatus, which is capable of continuously forming a sputtered film and a deposited film without exposing them to the atmosphere, was employed. Now, the formation of the ferromagnetic tunnel junction is explained.

First, after resist was patterned on the first electrode film 22, an $Ni_{80}Fe_{20}$ film (film thickness 20 nm) was formed by RF sputtering in a magnetic field to constitute the first ferromagnetic film 211. After that, an aluminum film with a film thickness of 5 nm was formed continuously without exposing the films to the atmosphere through an electron beam deposition method. Following this, heat treatment was performed in air at 60° C. for 24 hours, and then it was subjected to a lift-off process, whereby the insulating film 210 constituted of a thermally oxidized aluminum film was formed. Then, resist patterning was performed over its entire surface except for the areas where the magnetic domain control films 214 and 215 would be formed and superfluous $Ni_{80}Fe_{20}$ (20 nm)/thermally oxidized aluminum film (5 nm) was removed by Ar ion etching. Then, a buffer layer $Ti_{10}W_{90}$ (5 nm)/hard ferromagnetic layer $Co_{80}Pt_{20}$ (15 nm) was formed by DC sputtering to constitute the magnetic domain control films 214 and 215, and the resist was removed by the lift-off method to form the magnetic domain control films 214 and 215. Next, resist was patterned again, and followed by Ar ion etching and resist removal, the first ferromagnetic film 211, the intermediate insulating film 210 and the magnetic domain control films 214 and 215 were processed to achieve a specific shape.

Next, in order to form a short-preventing insulating film 213, a resist cover was formed at the area of the ferromagnetic tunnel junction 21 where the insulating film 213 would be formed, and after forming an alumina insulating film (layer thickness 50nm) by RF sputtering, the resist was lifted off, thereby forming a short-preventing insulating film 213. The short-preventing insulating film 213 was provided in order to ensure that no tunnel current would run in areas other than the ferromagnetic tunnel junction 21 by forming the ferromagnetic tunnel junction 21 at a specific size and to achieve insulation between the first electrode film 22 and the second electrode film 23 and insulation between the first ferromagnetic film 211 and the second ferromagnetic film 212. Next, resist was patterned to form the second ferromagnetic film 212, and a Co film with a film thickness of 10 nm was formed by RF sputtering in a magnetic field to constitute the second ferromagnetic film. Then the second ferromagnetic film 212 was finally achieved by the lift-off method. At this stage the direction of the magnetic field applied to form the second ferromagnetic film was set perpendicular to the direction in which the applied magnetic field was set when the first ferromagnetic film was formed.

Next, resist was patterned in order to form the magnetization pinning layer 216 and the second electrode film 23, the oxide layer on the surface of the Co film constituting the second ferromagnetic film was removed by sputter etching to achieve an ultimate film thickness of 5nm for the second ferromagnetic film 212, and then, a PtMn (15 nm)/Ta (10 nm)/Cu (100 nm)/Ta (10 nm) film was formed continuously by DC sputtering. The lift-off method was employed to achieve the PtMn magnetization pinning layer 216 and the second electrode film 23. It is to be noted that the Ta (10 nm) was used to form a layer to prevent oxidation during the process.

Next, an alumina film with a film thickness of 80 nm was formed by RF bias sputtering, thereby forming the upper insulating film 72. Then, an NiFe film (film thickness 2 μm) was formed by DC sputtering to constitute the upper magnetic shield film 52 and then it was patterned to achieve a specific shape by photolithography and etching technologies. Lastly, after a bump electrode film constituted of Cu was formed by plating and an alumina film with a film thickness of 30 μm was laid over it constituting a protective film. After this, machining and polishing were performed to achieve a specific size and the ferromagnetic tunnel junction 21 was exposed at the ABS. An MR head for reproduction with a junction area of 1 μm in width and 1 μm in length was achieved in this manner. In other words, the track width, the MR height and the MR shield gap distance in the magnetic head were set at 1 μm, 1 μm and 0.19 μm respectively.

The magnetic head without magnetic domain control films is produced by first achieving a specific shape for the first ferromagnetic film 211 and the insulating film 210 through the lift-off method and then forming the short-preventing insulating film 213 in a manner identical to that described earlier. Processes performed other than these are the same as those taken when providing magnetic domain control films.

The MR curves and the output waveforms of the MR heads for reproduction produced in the manner described above were examined. FIG. 48 shows the MR curve (measuring magnetic fields: ±400 e) of the magnetic head provided with the magnetic domain control films and FIG. 49 shows the MR curve of the magnetic head not provided with the magnetic domain control films. As the figures indicate, while the magnetic head provided with the magnetic domain control films achieves a smooth MR curve, the magnetic head not provided with the magnetic domain control films demonstrates an unstable MR curve, with hysteresis and step changes.

FIG. 50 shows the output waveform achieved by the magnetic head provided with the magnetic domain control films and FIG. 51 shows the output waveforms achieved by the magnetic head not provided with the magnetic domain control films. FIG. 51 demonstrates that the magnetic head without the magnetic domain control films only achieves an unstable output waveform with a high level of noise with variations in its baseline and output amplitude. In contrast, as demonstrated in FIG. 50, by providing the magnetic domain control films, a stable output waveform is achieved.

As the results described above indicate, by providing the magnetic domain control films, an MR curve and a waveform that are stable and noiseless are achieved.

(Embodiment 4)

Next, the characteristics of the magnetic head according to the present invention and an AMR head in the prior art are examined.

(Magnetic head according to the present invention)

A magnetic head that employs the CoFe/DLC/Co ferromagnetic tunnel junction in Embodiment 2 in its magnetoresistive film was produced and its reproduction sensitivity and reproduction output were examined for comparison with those achieved by a magnetic head that employs an NiFe film (AMR) in the prior art to constitute its magnetoresistive film. The film structure of the ferromagnetic tunnel junction includes the first ferromagnetic film 211 constituted of Co-50 at % Fe, the second ferromagnetic film 212 constituted of a Co film and the intermediate insulating film 210 constituted of a DLC film. The film thicknesses were set at 15 nm, 20 nm and 5 nm respectively for the first ferromagnetic film 211, the second ferromagnetic film 212 and the intermediate insulating film 210.

Next, the method employed for producing the magnetic head is explained. The ferromagnetic tunnel junction was produced in the method employed in Embodiment 2, and other films were produced in the same manner as in Embodiment 3 up to the formation of the upper magnetic shield film. The film thickness of the lower insulating film 71 was set at 100 nm whereas the film thickness of the upper insulating film 72 was set at 120nm, with the MR shield gap distance set at 0.26 $\mu$m. In addition, the track width and the MR height of the ferromagnetic tunnel junction type conversion element were set both at 1 $\mu$m.

Then, as shown in FIG. 24, an inductive magnetic conversion element was formed on the upper magnetic shield film as a write element. A magnetic head employing the ferromagnetic tunnel junction to constitute its magnetoresistive film was produced in this manner.

(AMR Magnetic head in the prior art: Example for Comparison)

For purposes of comparison, a magnetic head employing a NiFe film with an SAL bias to constitute the magnetoresistive film with a track width set at 1 $\mu$m, the MR height set at 1 $\mu$m and the MR shield gap distance set at 0.26 $\mu$m was also produced. The method of production employed is explained below. The magnetic head was produced in the same manner as was the magnetic head provided with the ferromagnetic tunnel junction according to the present invention up to the formation of the lower insulating film 71.

After the lower insulating film 71 was formed, a $Ni_{73}Fe_{18}Rh_9$ film (film thickness 10 nm), a Ta film (film thickness 8 nm), an $Ni_{80}Fe_{20}$ film (film thickness 17 nm) and a Ta film (film thickness 5 nm) were sequentially laminated by DC sputtering to constitute an SAL film, a magnetic separation film, an MR film and a protective film respectively, and a specific shape was achieved by photolithography and etching. Then, a $Ti_{10}W_{90}$ (10 nm)/$Co_{80}Pt_{20}$ (50 nm) and a Ta (10 nm)/Cu (100 nm)/Ta (10 nm) were formed by DC sputtering to constitute magnetic domain control films and electrode films respectively and they were machined to achieve a specific shape by the lift-off method. The subsequent steps starting with the formation of the upper insulating film 72 are the same as those taken when producing the magnetic head employing the ferromagnetic tunnel junction according to the present invention.

Using the magnetic heads thus prepared, signals were recorded and reproduced on a magnetic recording medium with a coercivity of 25000 e and a film thickness of 50 nm and the resulting output waveforms were examined. The results, which are presented in FIG. 52, indicate that with the magnetic head according to the present invention employing the ferromagnetic tunnel junction, a good waveform without distortion is achieved.

The magnetic head according to the embodiment described above achieved an reproduction output 4 to 5 times that achieved by the magnetic head employing the AMR film in the prior art (see FIG. 27.)

What is claimed is:

1. A ferromagnetic tunnel junction constituted by sequentially laminating a first ferromagnetic film, an insulating film and a second ferromagnetic film, wherein:

the barrier potential of said insulating film is within a range of 0.5 to 3 eV.

2. A ferromagnetic tunnel junction according to claim 1, wherein:

said barrier potential of said insulating film is within a range of 1.5 to 2.5 eV.

3. A ferromagnetic tunnel junction according to claim 1, wherein the coercivity of said first ferromagnetic film and the coercivity of said second ferromagnetic film are different from each other.

4. A ferromagnetic tunnel junction according to claim 1, wherein said first ferromagnetic film and said second ferromagnetic film are antiferromagnetically coupled via said insulating film.

5. A ferromagnetic tunnel junction according to claim 1, wherein said insulating film is constituted of an aluminum oxide film formed through heat treatment at 40 to 100 C in air after film formation.

6. A ferromagnetic tunnel junction according to claim 1, wherein:

said insulating film is constituted of a diamond-like carbon film.

7. A ferromagnetic tunnel junction according to claim 1, wherein:

the area of tunnel junction is at or less than 10 $\mu m^2$.

8. A magnetoresistive element comprising:

a ferromagnetic tunnel junction including an insulating film, a first ferromagnetic film and a second ferromagnetic film, with said first ferromagnetic film and said second ferromagnetic film laminated via said insulating film, the barrier potential of said insulating film being within a range of 0.5 to 3 eV.

9. A magnetoresistive element according to claim 8, wherein:

said barrier potential of said insulating film is within a range of 1.5 to 2.5 eV.

10. A magnetoresistive element according to claim 8, wherein the coercivity of said first ferromagnetic film and the coercivity of said second ferromagnetic film are different from each other.

11. A magnetoresistive element according to claim 8, wherein:

said first ferromagnetic film and said second ferromagnetic film are antiferromagnetically coupled via said insulating film.

12. A magnetoresistive element according to claim 8, wherein:

said insulating film is constituted of an aluminum oxide film formed through heat treatment at 40° to 100° C. in air after film formation.

13. A magnetoresistive element according to claim 8, wherein:

said insulating film is constituted of a diamond-like carbon film.

14. A magnetoresistive element according to claim 8, wherein:

the area of tunnel junction is at or less than 10 $\mu m^2$.

15. A magnetoresistive element according to claim 8, further comprising:

a magnetic domain control film provided adjacent to both end portions of either said first ferromagnetic film or said second ferromagnetic film.

16. A magnetoresistive element according to claim 15, wherein:

said magnetic domain control film is constituted of a hard ferromagnetic film.

17. A magnetoresistive element according to claim 16, wherein:

said hard ferromagnetic film is constituted of a Co alloy.

18. A magnetoresistive element according to claim 17, wherein:

said Co alloy is constituted of at least one alloy selected from CoPt, CoPtCr, CoPtTa, CoCrTa and CoPtTaCr.

19. A magnetoresistive element according to claim 15, wherein:

said magnetic domain control film is constituted of an antiferromagnetic film.

20. A magnetoresistive element according to claim 19, wherein:

said antiferromagnetic film is constituted of either a metallic antiferromagnetic material or an oxide antiferromagnetic material.

21. A magnetoresistive element according to claim 20, wherein:

said metallic antiferromagnetic material is a Mn alloy.

22. A magnetoresistive element according to claim 21, wherein:

said Mn alloy is constituted of at least one alloy selected from FeMn, NiMn, PtMn, RuMn, RhMn, IrMn, PdMn or an alloy thereof.

23. A magnetoresistive element according to claim 20, wherein:

said oxide antiferromagnetic material is constituted of at least one of NiO, NiCoO or $Fe_2O_3$.

24. A magnetoresistive element according to claim 15, wherein:

said magnetic easy axis of said ferromagnetic film provided with said magnetic domain control film extends perpendicular to the direction of said applied external magnetic field.

25. A magnetoresistive element according to claim 15, wherein:

of said first ferromagnetic film and said second ferromagnetic film, said ferromagnetic film not provided with said magnetic domain control film is provided with a magnetization pinning film.

26. A magnetoresistive element according to claim 25, wherein:

said magnetization pinning film is constituted of a hard ferromagnetic film.

27. A magnetoresistive element according to claim 25, wherein:

said magnetization pinning film is constituted of an antiferromagnetic film.

28. A magnetoresistive element according to claim 25, wherein:

of said first ferromagnetic film and said second ferromagnetic film, said magnetic easy axis of said ferromagnetic film provided with said magnetic domain control film extends perpendicular to a direction of said applied external magnetic field, whereas said magnetic easy axis of said ferromagnetic film provided with said magnetization pinning film extends parallel to said direction of said applied external magnetic field.

29. A magnetoresistive element according to claim 8, wherein:

the direction of magnetization of said first ferromagnetic film and the direction of magnetization of said second ferromagnetic film are not parallel to each other when an applied external magnetic field is at zero.

30. A magnetoresistive element according to claim 24, wherein:

said direction of magnetization of said first ferromagnetic film and said direction of magnetization of said second ferromagnetic film are perpendicular to each other.

31. A magnetoresistive element according to claim 8, wherein:

a magnetic easy axis of said first ferromagnetic film and a magnetic easy axis of said second ferromagnetic film are not parallel to each other.

32. A magnetoresistive element according to claim 8, wherein:

said magnetic easy axis of said first ferromagnetic film and said magnetic easy axis of said second ferromagnetic film are perpendicular to each other.

33. A magnetoresistive element according to claim 8, wherein:

of said first ferromagnetic film and said second ferromagnetic film, either one has a magnetic easy axis extending perpendicular to an applied external magnetic field, with a magnetic easy axis of another ferromagnetic film extending parallel to said applied external magnetic field.

34. A magnetoresistive element according to claim 8, wherein:

of said first ferromagnetic film and said second ferromagnetic film, the ferromagnetic film not provided with said magnetic domain control film is a hard ferromagnetic film with a coercivity higher than the coercivity of said ferromagnetic film provided with said magnetic domain control film.

35. A magnetic head comprising:

a slider with an air bearing surface at a side thereof facing opposite a magnetic recording medium; and at least one magnetic conversion element having a ferromagnetic tunnel junction, said ferromagnetic tunnel junction including an insulating film, a first ferromagnetic film and a second ferromagnetic film with said first ferromagnetic film and said second ferromagnetic film being laminated via said insulating film, the barrier potential of said insulating film being within a range of 0.5 to 3 eV.

36. A magnetic head according to claim 35, wherein:

said barrier potential of said insulating film is within a range of 1.5 to 2.5 eV.

37. A magnetic head according to claim 35, wherein:

the coercivity of said first ferromagnetic film and the coercivity of said second ferromagnetic film are different from each other.

38. A magnetic head according to claim 35, wherein:

said first ferromagnetic film and said second ferromagnetic film are antiferromagnetically coupled via said insulating film.

39. A magnetic head according to claim 35 wherein:

said insulating film is constituted of an aluminum oxide film formed through heat treatment at 40° to 100° C. in air after film formation.

40. A magnetic head according to claim 35 wherein:

said insulating film is constituted of a diamond-like carbon film.

41. A magnetic head according to claim 35, wherein:

the area of tunnel bonding is at or less than 11 μm.

42. A magnetic head according to claim 35, further comprising:

an electrode film having a first electrode film and a second electrode film, with said first electrode film connected to said first ferromagnetic film and said second electrode film connected to said second ferromagnetic film.

43. A magnetic head according to claim 35, wherein:

said first electrode film and said second electrode film are provided so that neither said first electrode film nor said second electrode film is exposed at said air bearing surface.

44. A magnetic head according to claim 43, wherein:

said ferromagnetic tunnel junction is exposed at said air bearing surface.

45. A magnetic head according to claim 35, further comprising:

an inductive magnetic conversion element.

46. A magnetic head according to claim 45, comprising:

a bottom magnetic shield film and an upper magnetic shield film, said ferromagnetic tunnel junction being provided between said bottom magnetic shield film and said upper magnetic shield film, said upper magnetic shield film being constituted of a magnetic film provided at said inductive magnetic conversion element.

47. A magnetic head according to claim 35, wherein:

a magnetic domain pinning film is provided at either said first ferromagnetic film or said second ferromagnetic film.

48. A magnetic head according to claim 47 wherein:

said magnetic domain pinning film is constituted of a hard ferromagnetic film.

49. A magnetic head according to claim 47, wherein:

said magnetic domain pinning film is constituted of an antiferromagnetic film.

50. A magnetic head according to claim 47 wherein:

of said first ferromagnetic film and said second ferromagnetic film, a ferromagnetic film without said magnetic domain pinning film is provided with a magnetic domain control film at both ends.

51. A magnetic head according to claim 50, wherein:

said magnetic domain control film is constituted of a hard ferromagnetic film.

52. A magnetic head according to claim 50, wherein:

said magnetic domain control film is constituted of an antiferromagnetic film so that exchange coupling is formed between said first ferromagnetic film or said second ferromagnetic film and said antiferromagnetic film.

* * * * *